US012765199B2

(12) United States Patent
Yi et al.

(10) Patent No.: US 12,765,199 B2
(45) Date of Patent: Oct. 13, 2026

(54) ARRAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Hong Yi, Beijing (CN); Mengqi Wang, Beijing (CN); Zhongliu Yang, Beijing (CN); Wenbo Chen, Beijing (CN); Xiaoyun Wang, Beijing (CN); Haigang Qing, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 414 days.

(21) Appl. No.: 18/557,107

(22) PCT Filed: Nov. 15, 2022

(86) PCT No.: PCT/CN2022/131951
§ 371 (c)(1),
(2) Date: Oct. 25, 2023

(87) PCT Pub. No.: WO2024/103254
PCT Pub. Date: May 23, 2024

(65) Prior Publication Data
US 2025/0089490 A1 Mar. 13, 2025

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
CPC ........... H10K 59/1213; H10K 59/1216; H10K 59/131; G09G 2300/0842; G09G 3/3233;
(Continued)

(56) References Cited

U.S. PATENT DOCUMENTS 10,748,981 B1 * 8/2020 Rieutort-Louis .... H10K 59/131
12,295,219 B2 * 5/2025 Choi .................... H10K 59/131
(Continued)

FOREIGN PATENT DOCUMENTS

CN 104200771 A 12/2014
CN 107068060 A 8/2017
(Continued)

OTHER PUBLICATIONS

International Search Report & Written Opinion mailed Jun. 23, 2023, regarding PCT/CN2022/131951.

*Primary Examiner* — Vinh T Lam
(74) *Attorney, Agent, or Firm* — Intellectual Valley Law, P.C.

(57) ABSTRACT

An array substrate is provided. The array substrate includes a voltage supply network. The voltage supply network includes, in a corner region of a peripheral area, a first peripheral voltage supply line; a plurality of second peripheral voltage supply lines; and an electrical connecting structure configured to connect the plurality of second peripheral voltage supply lines with the first peripheral voltage supply line. The electrical connecting structure crosses over at least one of the plurality of second peripheral voltage supply lines.

19 Claims, 30 Drawing Sheets

(58) Field of Classification Search
CPC ... G09G 2300/0861; G09G 2310/0251; G09G 2300/0426; G09G 2300/0819
See application file for complete search history.

(56) References Cited

U.S. PATENT DOCUMENTS

| | | | | |
|---|---|---|---|---|
| 2016/0027380 | A1* | 1/2016 | Kim | G09G 3/3233 315/172 |
| 2016/0035284 | A1* | 2/2016 | Jung | G06F 3/0412 345/82 |
| 2017/0221434 | A1* | 8/2017 | Shima | G09G 3/3611 |
| 2017/0221435 | A1* | 8/2017 | Shima | G09G 3/3611 |
| 2017/0287937 | A1* | 10/2017 | Ka | H10K 59/131 |
| 2017/0337873 | A1* | 11/2017 | Kim | G09G 3/3233 |
| 2018/0006105 | A1* | 1/2018 | Kim | H10K 59/1213 |
| 2018/0033370 | A1 | 2/2018 | Zheng | |
| 2018/0067356 | A1* | 3/2018 | Katsuta | G02F 1/13452 |
| 2018/0067357 | A1* | 3/2018 | Katsuta | H10K 59/122 |
| 2018/0082630 | A1* | 3/2018 | Kim | G09G 3/2092 |
| 2018/0158895 | A1* | 6/2018 | Lee | H10K 59/124 |
| 2018/0240856 | A1* | 8/2018 | Kim | H10K 59/124 |
| 2018/0259802 | A1* | 9/2018 | Koide | G02F 1/1343 |
| 2019/0096978 | A1* | 3/2019 | Jung | G09G 3/3275 |
| 2019/0305072 | A1* | 10/2019 | Park | H10D 86/441 |
| 2019/0393295 | A1* | 12/2019 | Moy | H10K 59/8792 |
| 2020/0019031 | A1* | 1/2020 | Koide | G02F 1/1345 |
| 2020/0144351 | A1* | 5/2020 | Liu | H10K 59/131 |
| 2020/0202784 | A1* | 6/2020 | Kim | G09G 3/3233 |
| 2020/0243637 | A1* | 7/2020 | Lee | H10K 59/1315 |
| 2020/0273940 | A1* | 8/2020 | Byun | G09G 3/3233 |
| 2020/0303421 | A1* | 9/2020 | Cho | G09G 3/3258 |
| 2021/0043134 | A1* | 2/2021 | Cho | G09G 3/3208 |
| 2021/0091164 | A1* | 3/2021 | Kim | G09G 3/3233 |
| 2021/0104196 | A1 | 4/2021 | Yuan | |
| 2021/0125543 | A1 | 4/2021 | Kim et al. | |
| 2021/0126078 | A1* | 4/2021 | Lee | G02F 1/13452 |
| 2021/0158733 | A1* | 5/2021 | Eom | G09G 3/006 |
| 2021/0183991 | A1* | 6/2021 | Shin | H10K 59/353 |
| 2021/0226167 | A1* | 7/2021 | Zhang | H10K 50/844 |
| 2021/0313410 | A1* | 10/2021 | Kim | H10K 59/121 |
| 2021/0376036 | A1* | 12/2021 | Park | H10K 59/131 |
| 2021/0376038 | A1* | 12/2021 | Won | H10D 86/441 |
| 2021/0391405 | A1* | 12/2021 | Lee | H10K 59/1213 |
| 2021/0391407 | A1* | 12/2021 | Yoon | G06F 1/1686 |
| 2022/0052141 | A1* | 2/2022 | Lee | H10K 59/121 |
| 2022/0140054 | A1* | 5/2022 | Youn | H10K 59/88 257/40 |
| 2022/0157913 | A1* | 5/2022 | Choi | G06F 3/0412 |
| 2022/0158126 | A1* | 5/2022 | Kim | H10K 59/122 |
| 2022/0181357 | A1* | 6/2022 | Xu | H10D 86/441 |
| 2022/0198974 | A1* | 6/2022 | Kim | G09G 3/3677 |
| 2022/0199655 | A1* | 6/2022 | Park | H10D 86/443 |
| 2022/0238622 | A1* | 7/2022 | Lee | H10K 59/131 |
| 2022/0320248 | A1* | 10/2022 | Bang | H10D 86/441 |
| 2022/0320253 | A1* | 10/2022 | Cho | G09G 3/3233 |
| 2022/0335902 | A1* | 10/2022 | Zeng | G09G 3/3266 |
| 2022/0336571 | A1* | 10/2022 | Chen | H10K 59/1315 |
| 2023/0060062 | A1* | 2/2023 | Cho | G09G 3/3233 |
| 2023/0079023 | A1* | 3/2023 | Lee | H10K 59/1213 257/40 |
| 2023/0105246 | A1* | 4/2023 | Park | H10K 59/131 257/40 |
| 2024/0090281 | A1* | 3/2024 | Yamada | G09F 9/30 |
| 2025/0268045 | A1* | 8/2025 | Zhou | H10K 59/1201 |

FOREIGN PATENT DOCUMENTS

| | | | |
|---|---|---|---|
| CN | 107665672 | A | 2/2018 |
| CN | 112102785 | A | 12/2020 |
| CN | 112802431 | A | 5/2021 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2022/131951, filed Nov. 15, 2022, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a voltage supply network; wherein the voltage supply network comprises, in a corner region of a peripheral area, a first peripheral voltage supply line; a plurality of second peripheral voltage supply lines; and an electrical connecting structure configured to connect the plurality of second peripheral voltage supply lines with the first peripheral voltage supply line; wherein the electrical connecting structure crosses over at least one of the plurality of second peripheral voltage supply lines.

Optionally, the plurality of second peripheral voltage supply lines are spaced apart from the first peripheral voltage supply line, respectively, by different distances.

Optionally, the array substrate further comprises a plurality of voltage supply lines extending along a first direction through a plurality of pixel driving circuit regions in a display area, the plurality of pixel driving circuit regions being adjacent to the corner region; wherein a respective second peripheral voltage supply line of the plurality of second peripheral voltage supply lines is connected to multiple voltage supply lines of the plurality of voltage supply lines extending through a respective region of the plurality of pixel driving circuit regions; and the plurality of pixel driving circuit regions are spaced apart from the first peripheral voltage supply line, respectively, by different distances.

Optionally, the electrical connecting structure is at least partially in a region between the first peripheral voltage supply line and the plurality of pixel driving circuit regions.

Optionally, an orthographic projection of the electrical connecting structure on a base substrate at least partially overlaps with an orthographic projection of at least one of the plurality of second peripheral voltage supply lines on the base substrate.

Optionally, the electrical connecting structure comprises a plurality of first connecting lines; and a respective first connecting line of the plurality of first connecting lines electrically connects at least one of the plurality of second peripheral voltage supply lines with the first peripheral voltage supply line.

Optionally, the electrical connecting structure electrically connects the plurality of second peripheral voltage supply lines with each other, through one or more of the plurality of first connecting lines.

Optionally, at least a first one of the plurality of first connecting lines electrically connects each of the plurality of second peripheral voltage supply lines with the first peripheral voltage supply line; and at least a second one of the plurality of first connecting lines electrically connects only one of the plurality of second peripheral voltage supply lines with the first peripheral voltage supply line.

Optionally, the electrical connecting structure further comprises a plurality of third peripheral voltage supply lines; wherein the plurality of first connecting lines and the plurality of third peripheral voltage supply lines interconnect with each other; and an orthographic projection of the plurality of third peripheral voltage supply lines on a base substrate at least partially overlaps with an orthographic projection of the plurality of second peripheral voltage supply lines on the base substrate.

Optionally, the plurality of first connecting lines and the plurality of third peripheral voltage supply lines are in a same layer, and are parts of a unitary structure.

Optionally, a respective first connecting line of the plurality of first connecting lines is connected to one or more second peripheral voltage supply lines of the plurality of second peripheral voltage supply lines through one or more first vias extending through at least an insulating layer; the respective first connecting line of the plurality of first connecting lines is connected to the first peripheral voltage supply line through one or more second vias extending through at least the insulating layer; and a respective third peripheral voltage supply line of the plurality of third peripheral voltage supply lines is connected to a respective second peripheral voltage supply line of the plurality of second peripheral voltage supply lines through one or more third vias extending through at least the insulating layer.

Optionally, the electrical connecting structure comprises a connecting plate; and the connecting plate is in a layer different from the first peripheral voltage supply line and the plurality of second peripheral voltage supply lines.

Optionally, the array substrate is absent of an insulating layer between the connecting plate and the first peripheral voltage supply line; and the connecting plate is in direct contact with the first peripheral voltage supply line.

Optionally, the connecting plate is a unitary structure; an orthographic projection of the connecting plate on a base substrate at least partially overlaps with an orthographic projection of the first peripheral voltage supply line on the base substrate; and an orthographic projection of the connecting plate on the base substrate at least partially overlaps with an orthographic projection of the plurality of second peripheral voltage supply lines on the base substrate.

Optionally, the array substrate comprises one or more grooves extending at least partially into the connecting plate; wherein at least one groove of the one or more grooves is in a region between two anode connecting pads of a plurality of anode connecting pads that are directly adjacent to the at least one groove, where an average distance between the two anode connecting pads is greater than an average value of average distances respectively between pairs of directly adjacent anode connecting pads of the plurality of anode connecting pads.

Optionally, the electrical connecting structure is in an additional display area where multiple light emitting elements are present, and transistors and capacitors of multiple pixel driving circuits are absent; the array substrate further comprises a plurality of anode connecting pads extending from a display area into the additional display area; and a respective anode connecting pad of the plurality of anode connecting pads electrically connects an anode of a respective light emitting element of the multiple light emitting elements in the additional display area to a respective pixel driving circuit of the multiple pixel driving circuits in the display area.

Optionally, at least a portion of the first peripheral voltage supply line is in the additional display area; an orthographic projection of the plurality of anode connecting pads on a base substrate at least partially overlaps with an orthographic projection of the first peripheral voltage supply line on the base substrate; and the respective anode connecting pad crosses over at least one of the plurality of second peripheral voltage supply lines.

Optionally, the electrical connecting structure comprises a plurality of first connecting lines; and an orthographic projection of the plurality of anode connecting pads on a base substrate at least partially overlaps with an orthographic projection of the plurality of first connecting lines on the base substrate.

Optionally, the electrical connecting structure comprises a plurality of first connecting lines; the plurality of first connecting lines and the plurality of anode connecting pads do not cross over each other; and an orthographic projection of a respective first connecting line of the plurality of first connecting lines on a base substrate is between orthographic projections of two adjacent anode connecting pads of the plurality of anode connecting pads on the base substrate.

In another aspect, the present disclosure provides a display apparatus, comprising the array substrate described herein or fabricated by a method described herein, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate comprising a voltage supply network. Optionally, the voltage supply network comprises, in a corner region of a peripheral area, a first peripheral voltage supply line; a plurality of second peripheral voltage supply lines; and an electrical connecting structure configured to connect the plurality of second peripheral voltage supply lines with the first peripheral voltage supply line. Optionally, the electrical connecting structure crosses over at least one of the plurality of second peripheral voltage supply lines.

Figure 1:
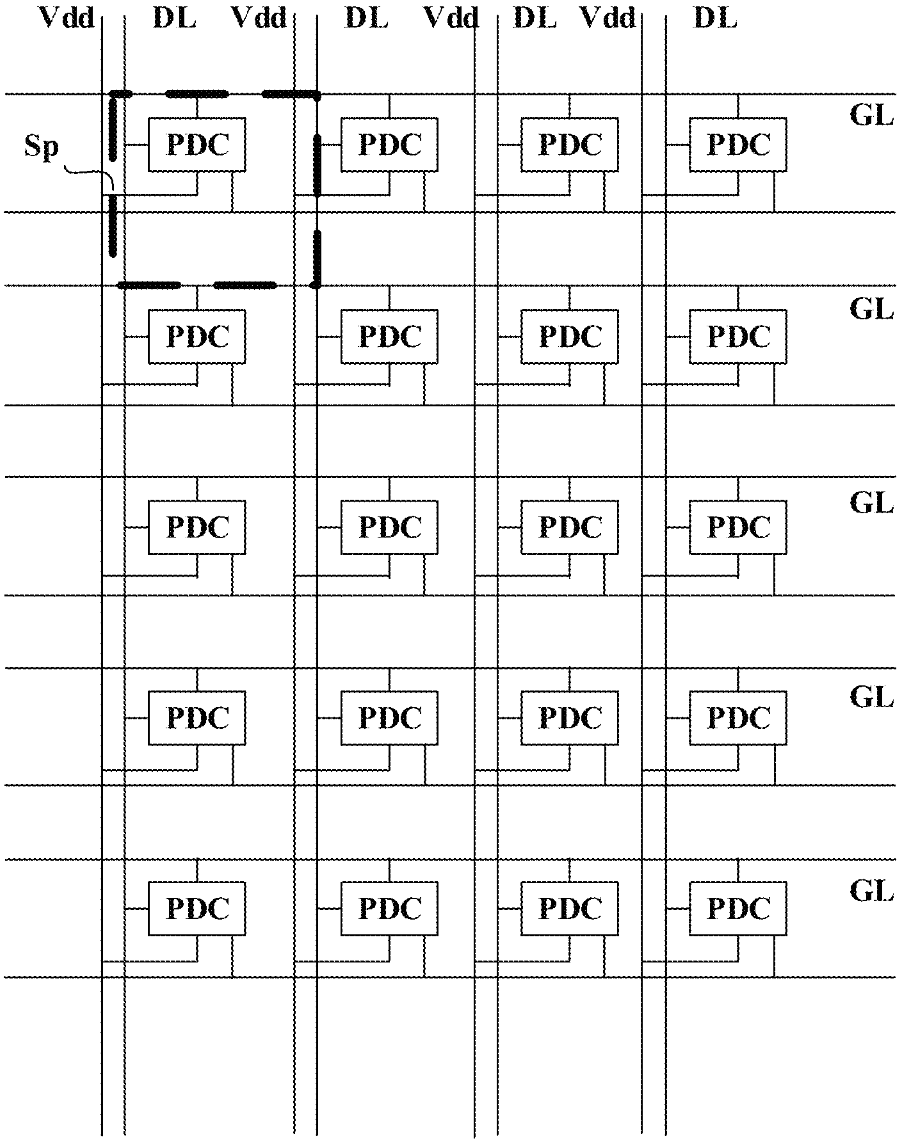
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, a plurality of voltage supply line Vdd. Light emission in a respective subpixel Sp is driven by a respective pixel driving circuit PDC. In one example, a high voltage signal (e.g., a VDD signal) is input, through the respective high voltage supply line of the plurality of voltage supply line Vdd, to the respective pixel driving circuit PDC connected to an anode of the light emitting element; a low voltage signal (e.g., a VSS signal) is input, through a low voltage supply line Vss, to a cathode of the light emitting element. A voltage difference between the high voltage signal (e.g., the VDD signal) and the low voltage signal (e.g., the VSS signal) is a driving voltage $\Delta V$ that drives light emission in the light emitting element.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 2:
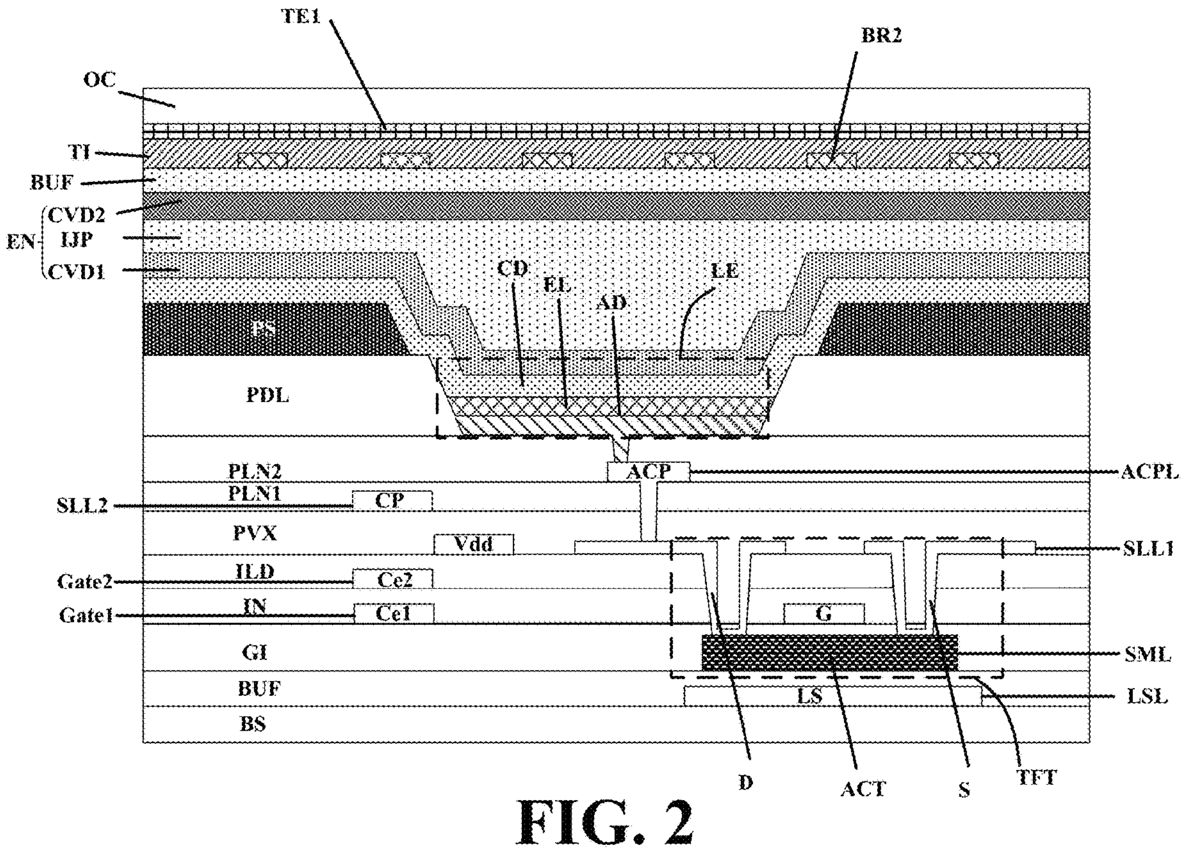
FIG. 2 illustrates a detailed structure in a display region in an array substrate in some embodiments according to the present disclosure.

FIG. 2 illustrates a detailed structure in a display region in an array substrate in some embodiments according to the present disclosure. Referring to FIG. 2, the array substrate in the display region in some embodiments includes a base substrate BS (e.g., a flexible base substrate); a light shield LS on the base substrate BS; a buffer layer BUF on a side of the light shield LS away from the base substrate BS; an active layer ACT of a respective one of a plurality of thin film transistors TFT on a side of the light shield LS away from the base substrate BS; a gate insulating layer GI on a side of the active layer ACT away from the base substrate BS; a gate electrode G and a first capacitor electrode Ce1 (both are parts of a first conductive layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second conductive layer) on a side of the insulating layer IN away from the gate insulating layer GI; an inter-layer dielectric layer ILD on a side of the second capacitor electrode Ce2 away from the gate insulating layer GI; a first electrode S and a second electrode D (e.g., source electrode and drain electrode of a transistor) and a plurality of voltage supply signal lines Vdd on a side of the inter-layer dielectric layer ILD away from the gate insulating layer GI; a passivation layer PVX on a side of the first electrode S and the second electrode D and the plurality of voltage supply signal lines Vdd away from the inter-layer dielectric layer ILD; a connecting pad CP on a side of the passivation layer PVX away from the inter-layer dielectric layer ILD; a first planarization layer PLN1 on a side of the connecting pad CP away from the passivation layer PVX; a respective anode connecting pad of a plurality of anode connecting pads ACP on a side of the first planarization layer PLN1 away from the passivation layer PVX; a second planarization layer PLN2 on side of the respective anode connecting pad away from the first planarization layer PLN1; a pixel definition layer PDL defining a subpixel aperture and on a side of the second planarization layer PLN2 away from the base substrate BS;

and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The array substrate in the display region further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The array substrate in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI. Optionally, the array substrate in the display region does not include the passivation layer PVX, e.g., the inter-layer dielectric layer ILD is in direct contact with the first planarization layer PLN1.

Referring to FIG. 2, the array substrate includes a light shield layer LSL, a semiconductor material layer SML, a first conductive layer Gate1, a second conductive layer Gate2, a first signal line layer SLL1, a second signal line layer SLL2, and an anode connecting pad layer ACPL. The array substrate further includes a buffer layer BUF between the base substrate BS and the gate insulating layer GI, an insulating layer IN between the first conductive layer Gate1 and the second conductive layer Gate2; an inter-layer dielectric layer ILD between the second conductive layer Gate2 and the first signal line layer SLL1; a passivation layer PVX between the first signal line layer SLL1 and the second signal line layer SLL2; and a first planarization layer PLN1 between the second signal line layer SLL2 and the anode connecting pad layer ACPL.

Figure 3:
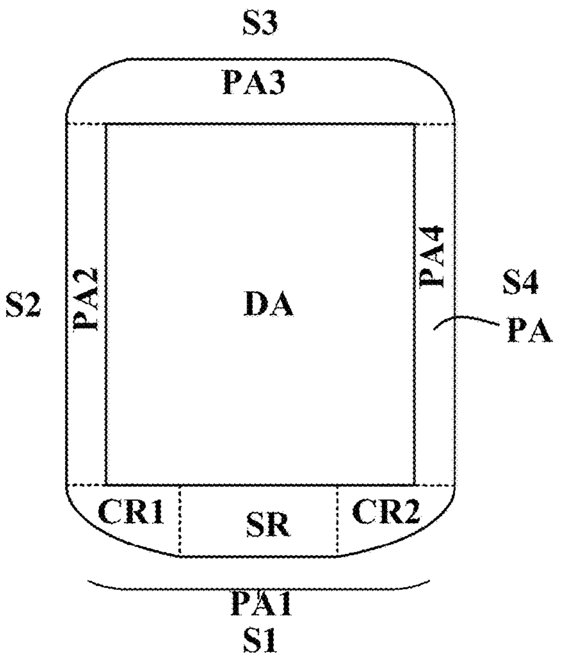
FIG. 3 is a schematic diagram illustrating a display area and a peripheral area in an array substrate in some embodiments according to the present disclosure.

FIG. 3 is a schematic diagram illustrating a display area and a peripheral area in an array substrate in some embodiments according to the present disclosure. Referring to FIG. 3, in some embodiments, the array substrate includes a display area DA and a peripheral area PA. In some embodiments, the peripheral area PA includes a first sub-area PA1 on a first side S1 of the display area DA, a second sub-area PA2 on a second side S2 of the display area DA, a third sub-area PA3 on a third side S3 of the display area DA, a fourth sub-area PA4 on a fourth side S4 of the display area DA. Optionally, the first side S1 and the third side S3 are opposite to each other. Optionally, the second side S2 and the fourth side S4 are opposite to each other. Optionally, the first sub-area PA1 is a sub-area where signal lines of the array substrate are connected to an integrated circuit.

As used herein, the term “display area” refers to an area of an array substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding to a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term “peripheral area” refers to an area of an array substrate in a display panel where various circuits and wires are provided to transmit signals to the display substrate. To increase the transparency of a display apparatus having the array substrate, non-transparent or opaque components of the display apparatus (e.g., battery, printed circuit board, metal frame), can be disposed in the peripheral area rather than in the display areas.

In some embodiments, the first sub-area PA1 includes a side region SR and one or more corner regions (e.g., a first corner region CR1 and a second corner region CR2). The one or more corner regions are respectively at a corner of the display panel. The one or more corner regions respectively connect the side region SR to one or more adjacent sub-areas of the peripheral area PA. For example, the first corner region CR1 connects the side region SR to the second sub-area PA2, and the second corner region CR2 connects the side region SR to the fourth sub-area PA4.

Figure 4:
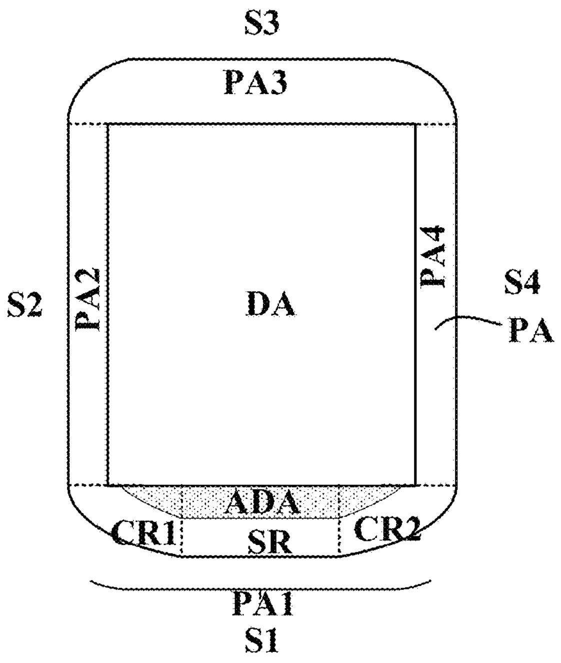
FIG. 4 is a schematic diagram illustrating a display area and a peripheral area in an array substrate in some embodiments according to the present disclosure.

FIG. 4 is a schematic diagram illustrating a display area and a peripheral area in an array substrate in some embodiments according to the present disclosure. Referring to FIG. 4, in some embodiments, the array substrate has an additional display area ADA in addition to the display area DA. Comparing FIG. 4 with FIG. 3, in some embodiments, the additional display area ADA extends away from the display area DA into the side region SR in FIG. 3, resulting in a reduced side region.

Figure 5:
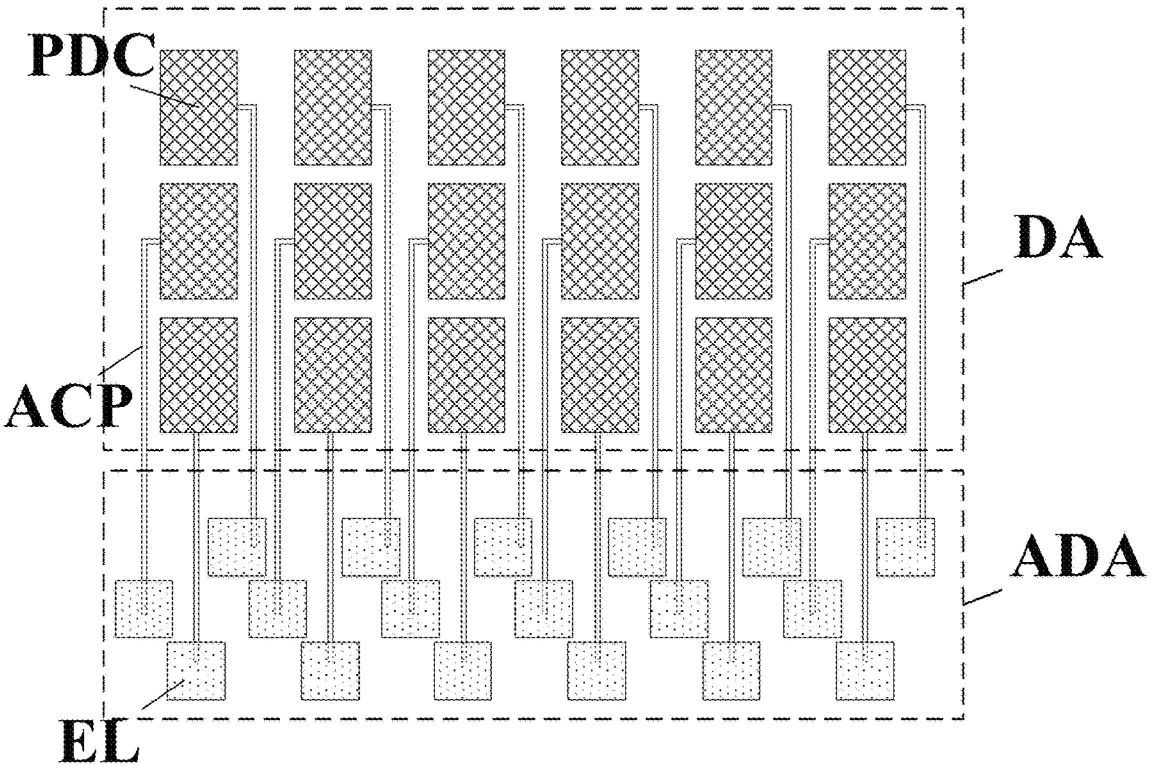
FIG. 5 illustrates an arrangement of pixel driving circuits and light emitting layers in a region around a border between a display area and an additional display area in some embodiments according to the present disclosure.

In some embodiments, pixel driving circuits are disposed in the display area DA. Light emitting layers corresponding to a number of pixel driving circuits along the border between the display area DA and the additional display area ADA, however, are disposed in the additional display area ADA. Because these driving circuits are disposed in the display area DA while the corresponding light emitting layers are disposed in the additional display area ADA, the plurality of anode connecting pads (e.g., ACP depicted in FIG. 2) connecting these driving circuits and the corresponding light emitting layers extend from the display area DA into the additional display area ADA. FIG. 5 illustrates an arrangement of pixel driving circuits and light emitting layers in a region around a border between a display area and an additional display area in some embodiments according to the present disclosure. Referring to FIG. 5, the plurality of anode connecting pads ACP connecting a respective pixel driving circuit PDC and a respective light emitting layer EL extends from the display area DA into the additional display area ADA. The additional display area ADA is absent of pixel driving circuits, and includes other components such as power supply lines.

Figure 6:
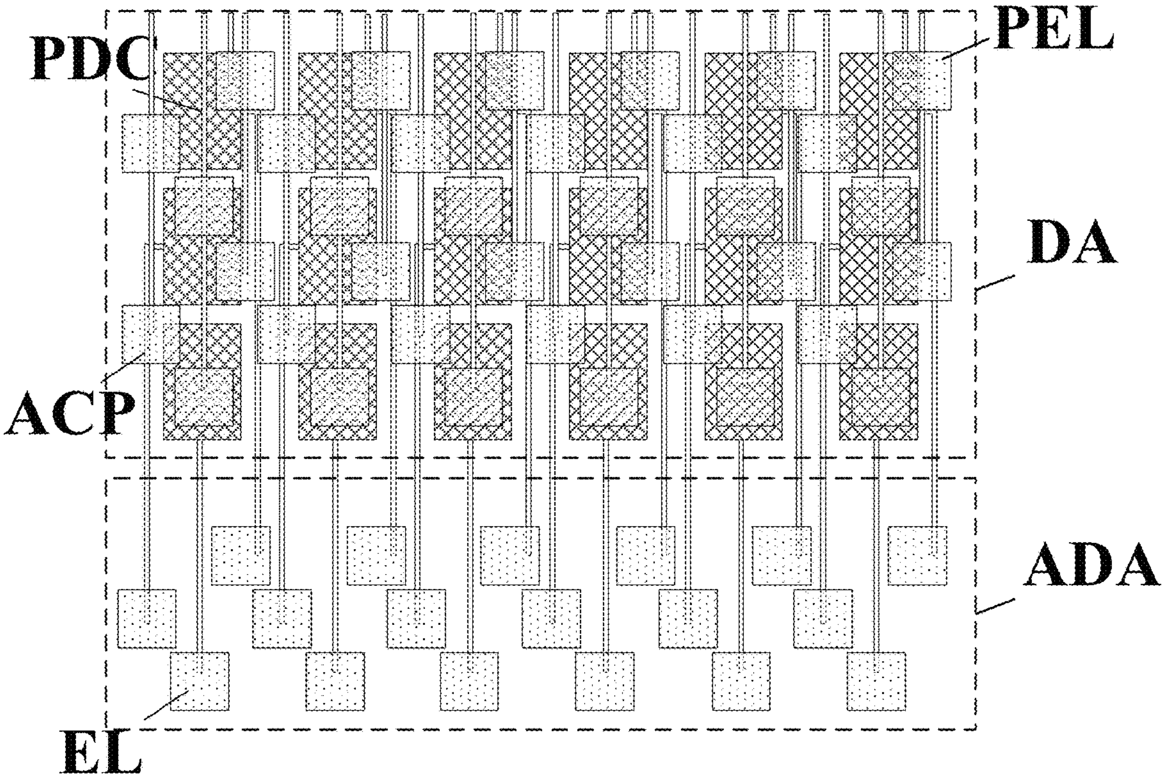
FIG. 6 illustrates an arrangement of pixel driving circuits and light emitting layers in a region around a border between a display area and an additional display area in some embodiments according to the present disclosure.

FIG. 6 illustrates an arrangement of pixel driving circuits and light emitting layers in a region around a border between a display area and an additional display area in some embodiments according to the present disclosure. Referring to FIG. 6, because the light emitting layers corresponding to the pixel driving circuits in the display area DA are disposed in the additional display area ADA, the region may provide space for receiving light emitting layers (denoted as PEL in FIG. 6) from previous rows of pixel driving circuit.

Figure 7:
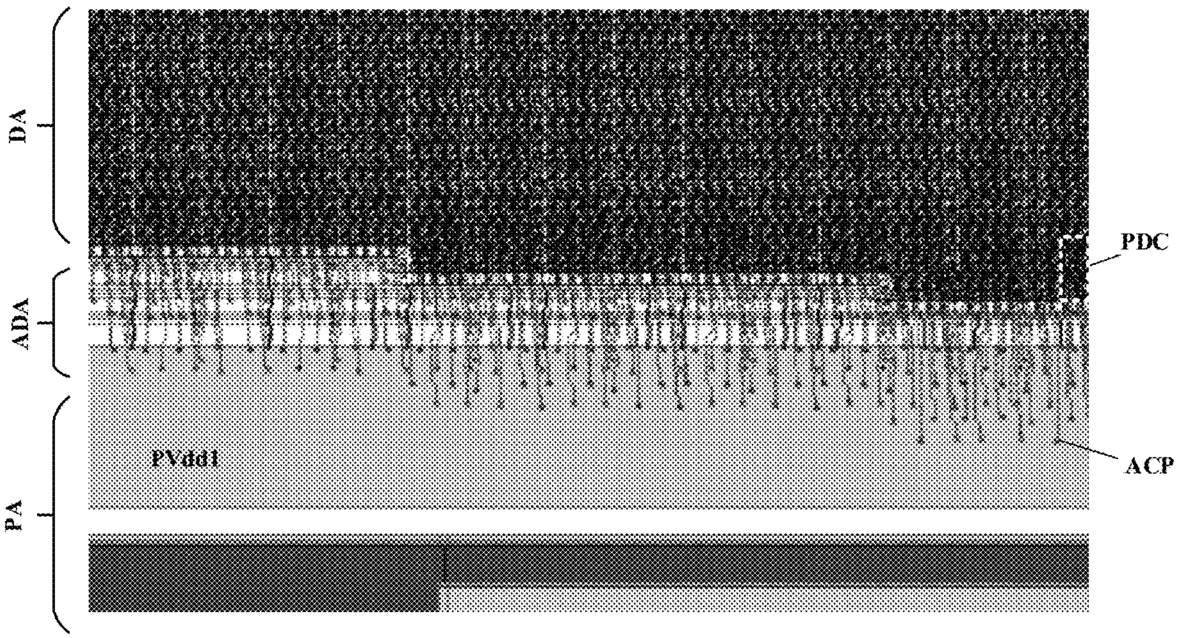
FIG. 7 shows an image of several layers in a region around a border between a display area and an additional display area in some embodiments according to the present disclosure.

FIG. 7 shows an image of several layers in a region around a border between a display area and an additional display area in some embodiments according to the present disclosure. Referring to FIG. 7, the array substrate in the region includes a first peripheral voltage supply line PVdd1 (configured to supply a voltage supply signal to the plurality of voltage supply lines Vdd in FIG. 1). At least a portion of the first peripheral voltage supply line PVdd1 is in the additional display area ADA. An orthographic projection of the plurality of anode connecting pads ACP extending from the display area DA into the additional display area ADA on a base substrate at least partially overlaps with an orthographic projection of the first peripheral voltage supply line PVdd1 on the base substrate.

Referring to FIG. 1, the plurality of voltage supply lines Vdd in the array substrate extends along a column direction. Referring to FIG. 7, the first peripheral voltage supply line PVdd1 extends along a row direction different from the column direction.

In a related array substrate, voltage supply lines configured to provide voltage signals to the side region SR in FIG. 3 and FIG. 4 are typically connected to the first peripheral voltage supply line PVdd1, and extend along the column direction into the side region SR to provide voltage signals to the side region SR.

In the related array substrate, voltage supply lines configured to provide voltage signals to a corner region (e.g., the first corner region CR1 and the second corner region CR2) are typically connected to a plurality of second peripheral voltage supply lines. The plurality of second peripheral voltage supply lines extend along the row direction, and is in turn connected to a portion of the first peripheral voltage supply line PVdd1 in the corner region of the array substrate.

In the related array substrate, the voltage supply lines configured to provide voltage signals to the corner region and the voltage supply lines configured to provide voltage signals to the side region have different layouts. The inventors of the present disclosure discover that, due to the difference in the layouts, the voltage supply lines configured to provide voltage signals to the corner region and the voltage supply lines configured to provide voltage signals to the side region in the related array substrate have different resistances and different loadings. These differences lead to display non-uniformity between subpixels in different regions, e.g., between subpixels in the corner region and subpixels in the side region. The array substrate according to the present disclosure effectively obviates these issues in the related array substrate.

Figure 8:
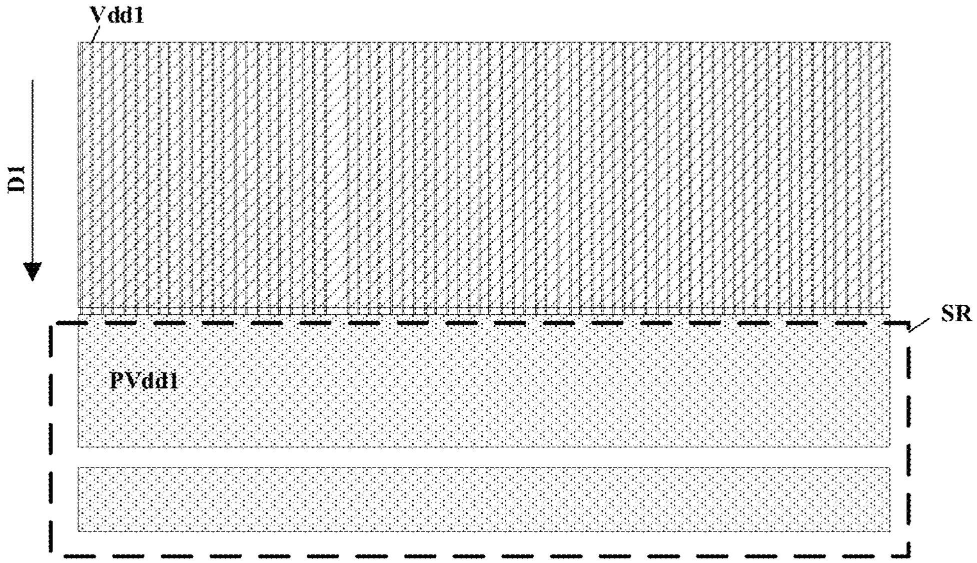
FIG. 8 illustrates connection layouts of voltage supply lines configured to provide voltage signals to a side region in an array substrate in some embodiments according to the present disclosure.

FIG. 8 illustrates connection layouts of voltage supply lines configured to provide voltage signals to a side region in an array substrate in some embodiments according to the present disclosure. Referring to FIG. 8, the voltage supply lines Vdd1 configured to provide voltage signals to a side region SR in an array substrate extend along a first direction D1 into the side region SR to connect with the first peripheral voltage supply line PVdd1. In one example, the first direction D1 is substantially parallel to the column direction along which a column of subpixels is arranged. In another example, the first direction D1 is substantially parallel to the extension direction of a plurality of data lines (see, e.g., DL in FIG. 1).

Figure 9:
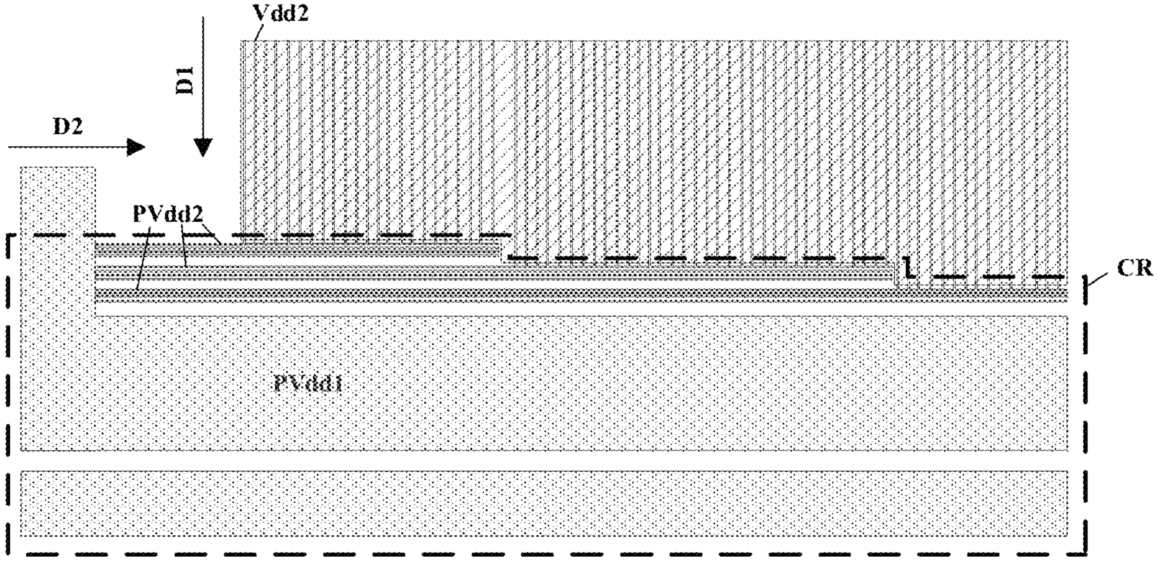
FIG. 9 illustrates connection layouts of voltage supply lines configured to provide voltage signals to a corner region in an array substrate in some embodiments according to the present disclosure.

FIG. 9 illustrates connection layouts of voltage supply lines configured to provide voltage signals to a corner region in an array substrate in some embodiments according to the present disclosure. Referring to FIG. 9, the voltage supply lines Vdd2 configured to provide voltage signals to a corner region CR are connected with a plurality of second peripheral voltage supply lines PVdd2. The plurality of second peripheral voltage supply lines PVdd2 extend along a second direction D2, and is in turn connected to a portion of the first peripheral voltage supply line PVdd1 in the corner region CR of the array substrate. The second direction D2 is different from the first direction D1. In one example, the second direction D2 is substantially parallel to the row direction along which a row of subpixels is arranged. In another example, the second direction D2 is substantially perpendicular to the first direction D1. In another example, the first direction D1 is substantially parallel to the extension direction of a plurality of gate lines (see, e.g., GL in FIG. 1).

As used herein, the term "substantially parallel" means that an angle is in the range of 0 degree to approximately 30 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees. As used herein, the term "substantially perpendicular" means that an angle is in the range of approximately 60 degrees to approximately 120 degrees, e.g., approximately 85 degrees to approximately 95 degrees, approximately 80 degrees to approximately 100 degrees, approximately 75 degrees to approximately 105 degrees, approximately 70 degrees to approximately 110 degrees, approximately 65 degrees to approximately 115 degrees, approximately 60 degrees to approximately 120 degrees.

Figure 10:
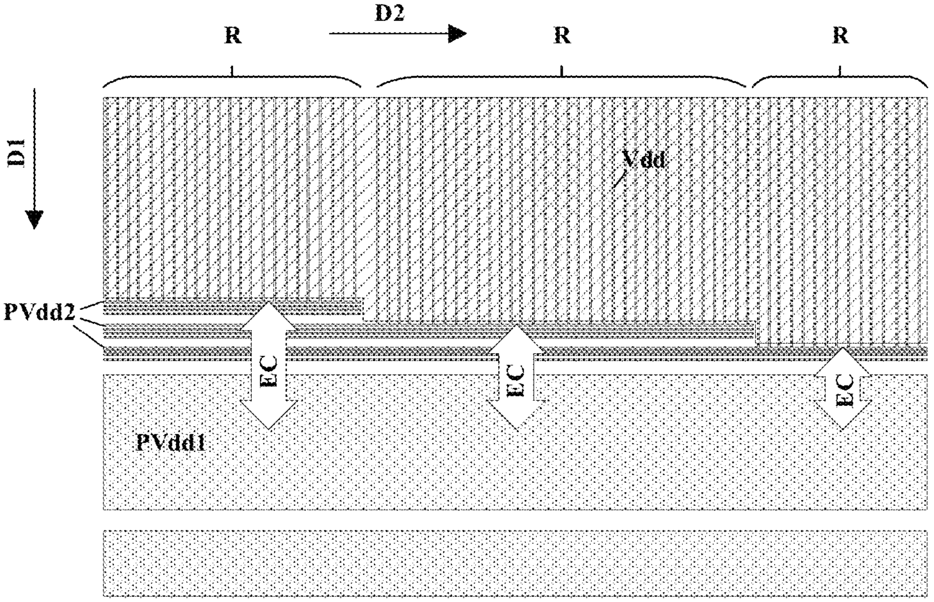
FIG. 10 illustrates the structure of a voltage supply network in an array substrate in some embodiments according to the present disclosure.

The inventors of the present disclosure discover an array substrate with a unique voltage supply network in the peripheral area can successfully obviate the display non-uniformity issue in the related array substrate. FIG. 10 illustrates the structure of a voltage supply network in an array substrate in some embodiments according to the present disclosure. Referring to FIG. 10, the voltage supply network in some embodiments includes, in a corner region, a first peripheral voltage supply line PVdd1, and a plurality of second peripheral voltage supply lines PVdd2 extending substantially along a second direction D2. The plurality of second peripheral voltage supply lines PVdd2 are spaced apart from the first peripheral voltage supply line PVdd1, respectively, by different distances. The array substrate includes voltage supply lines extending through a plurality of pixel driving circuit regions R in the display area, the voltage supply lines extending along a first direction D1. The plurality of pixel driving circuit regions R each includes pixel driving circuits configured to drive light emission in the array substrate. The plurality of pixel driving circuit regions R are spaced apart from the first peripheral voltage supply line PVdd1, respectively, by different distances. A respective second peripheral voltage supply line of the plurality of second peripheral voltage supply lines PVdd2 is connected to multiple voltage supply lines extending through a respective region of the plurality of pixel driving circuit regions R in the display area.

In some embodiments, the voltage supply network further includes an electrical connecting structure EC configured to connect the plurality of second peripheral voltage supply lines PVdd2 with the first peripheral voltage supply line PVdd1. The electrical connecting structure EC is at least partially in a region between the first peripheral voltage supply line PVdd1 and the plurality of pixel driving circuit regions R. The electrical connecting structure EC crosses over at least one of the plurality of second peripheral voltage supply lines PVdd2. An orthographic projection of the electrical connecting structure EC on a base substrate at least partially overlaps with an orthographic projection of at least one of the plurality of second peripheral voltage supply lines PVdd2 on the base substrate.

Figure 11:
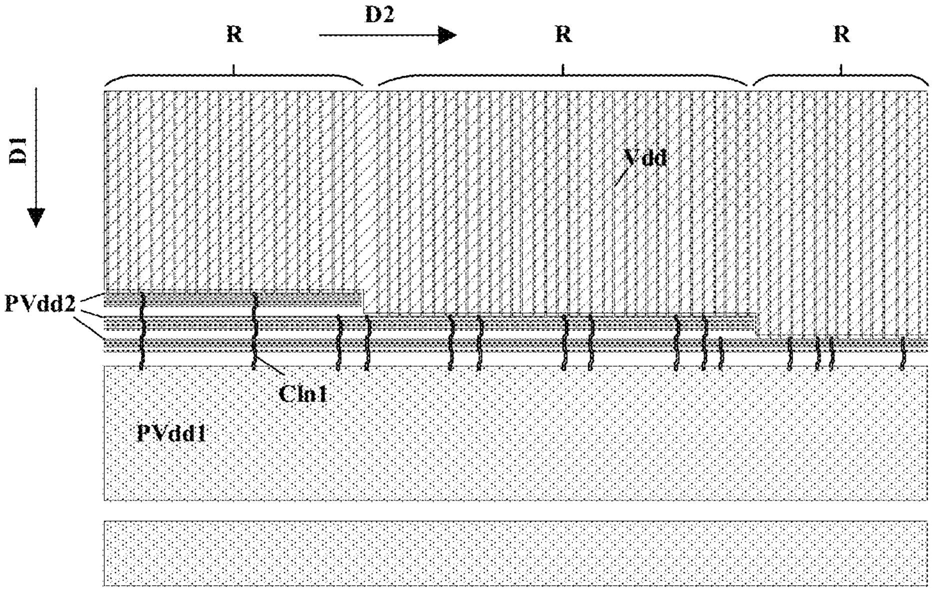
FIG. 11 illustrates the structure of a voltage supply network in an array substrate in some embodiments according to the present disclosure.
Figure 12:
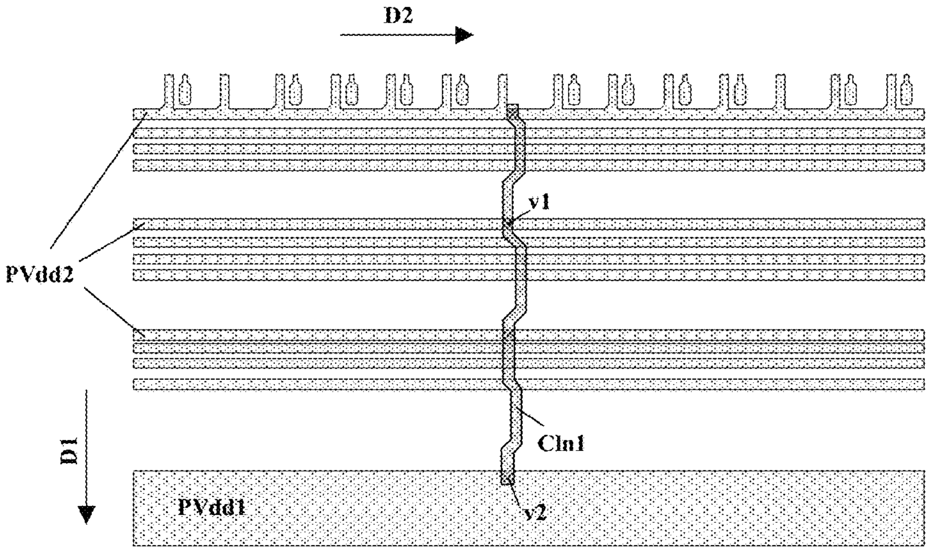
FIG. 12 illustrates the structure of a voltage supply network in an array substrate in some embodiments according to the present disclosure.

FIG. 11 illustrates the structure of a voltage supply network in an array substrate in some embodiments according to the present disclosure. FIG. 12 is a zoom-in view of a voltage supply network in an array substrate in some embodiments according to the present disclosure. Referring to FIG. 11 and FIG. 12, the electrical connecting structure in some embodiments includes a plurality of first connecting lines Cln1. A respective first connecting line of the plurality of first connecting lines Cln1 electrically connects at least one of the plurality of second peripheral voltage supply lines PVdd2 with the first peripheral voltage supply line PVdd1. Optionally, at least one of the plurality of first connecting lines Cln1 (e.g., the first connecting line depicted in FIG. 12 or the first connecting line on the left in FIG. 11) electrically connects each of the plurality of second peripheral voltage supply lines PVdd2 with the first peripheral voltage supply line PVdd1. Optionally, at least one of the plurality of first connecting lines Cln1 (e.g., the first connecting line on the right in FIG. 11) electrically connects only one of the plurality of second peripheral voltage supply lines PVdd2 with the first peripheral voltage supply line PVdd1.

The voltage supply network electrically connects the plurality of second peripheral voltage supply lines PVdd2 with the first peripheral voltage supply line PVdd1. Moreover, the electrical connecting structure electrically connects the plurality of second peripheral voltage supply lines PVdd2 with each other, through one or more of the plurality of first connecting lines Cln1. The voltage supply network renders the voltage supply lines configured to provide voltage signals to the corner region and the voltage supply lines configured to provide voltage signals to the side region to have substantially the same resistances and loading, resulting in significantly enhanced display uniformity in the array substrate.

In some embodiments, the plurality of first connecting lines Cln1 are in a layer different from at least one of the first peripheral voltage supply line PVdd1, the plurality of second peripheral voltage supply lines PVdd2, or the plurality of voltage supply line Vdd. Optionally, the plurality of first connecting lines Cln1 are in a layer different from the first peripheral voltage supply line PVdd1, the plurality of second peripheral voltage supply lines PVdd2, and the plurality of voltage supply line Vdd. Optionally, the plurality of first connecting lines Cln1 are in a second signal line layer (e.g., SLL2 in FIG. 2). Optionally, the first peripheral voltage supply line PVdd1, the plurality of second peripheral voltage supply lines PVdd2, and the plurality of voltage supply line Vdd are in a first signal line layer (e.g., SLL1 in FIG. 2).

Figure 13:
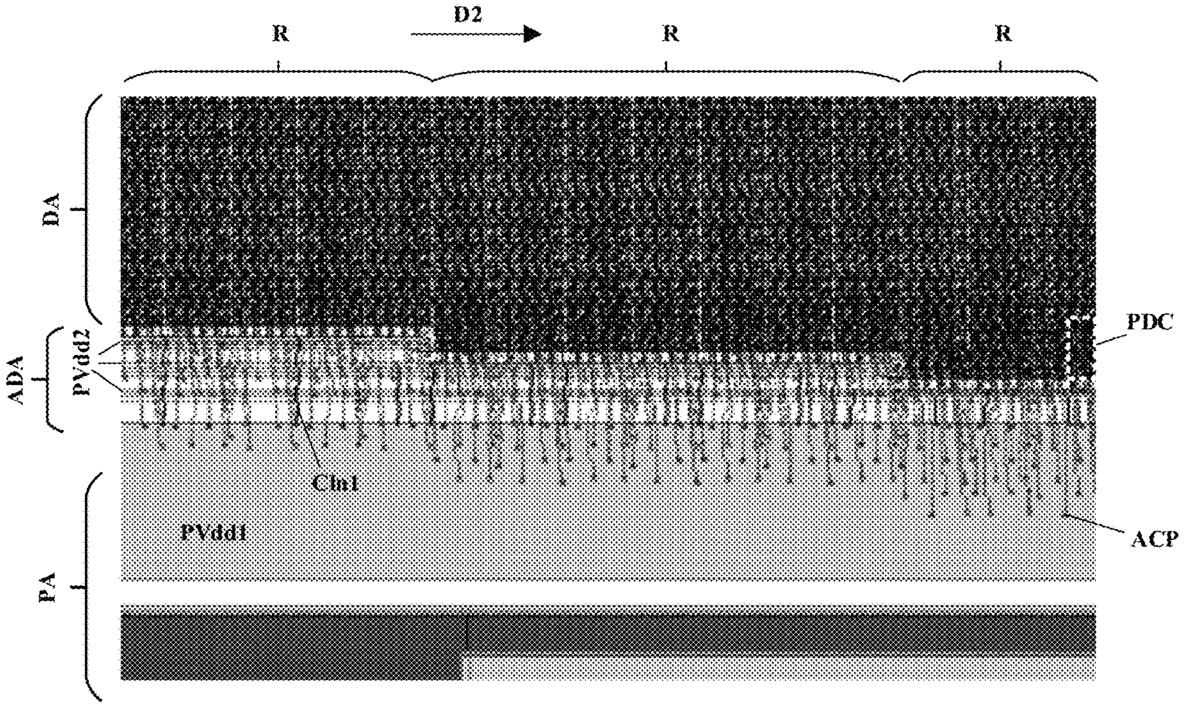
FIG. 13 shows an image of several layers in a region around a border between a display area and an additional display area in some embodiments according to the present disclosure.

In some embodiments, the electrical connecting structure (e.g., the plurality of first connecting lines Cln1) is in the additional display area (e.g., ADA in FIG. 4). In some embodiments, the array substrate in the additional display area further includes a plurality of anode connecting pads ACP extending from the display area DA into the additional display area ADA. FIG. 13 shows an image of several layers in a region around a border between a display area and an additional display area in some embodiments according to the present disclosure. Referring to FIG. 13, the plurality of anode connecting pads ACP cross over the plurality of second peripheral voltage supply lines PVdd2. Optionally, the plurality of first connecting lines Cln1 and the plurality of anode connecting pads ACP do not cross over each other. Optionally, an orthographic projection of a respective first connecting line of the plurality of first connecting lines Cln1 on a base substrate is between orthographic projections of two adjacent anode connecting pads of the plurality of anode connecting pads ACP on the base substrate, to ensure a substantially uniform line width in patterning the plurality of anode connecting pads ACP.

Figure 14:
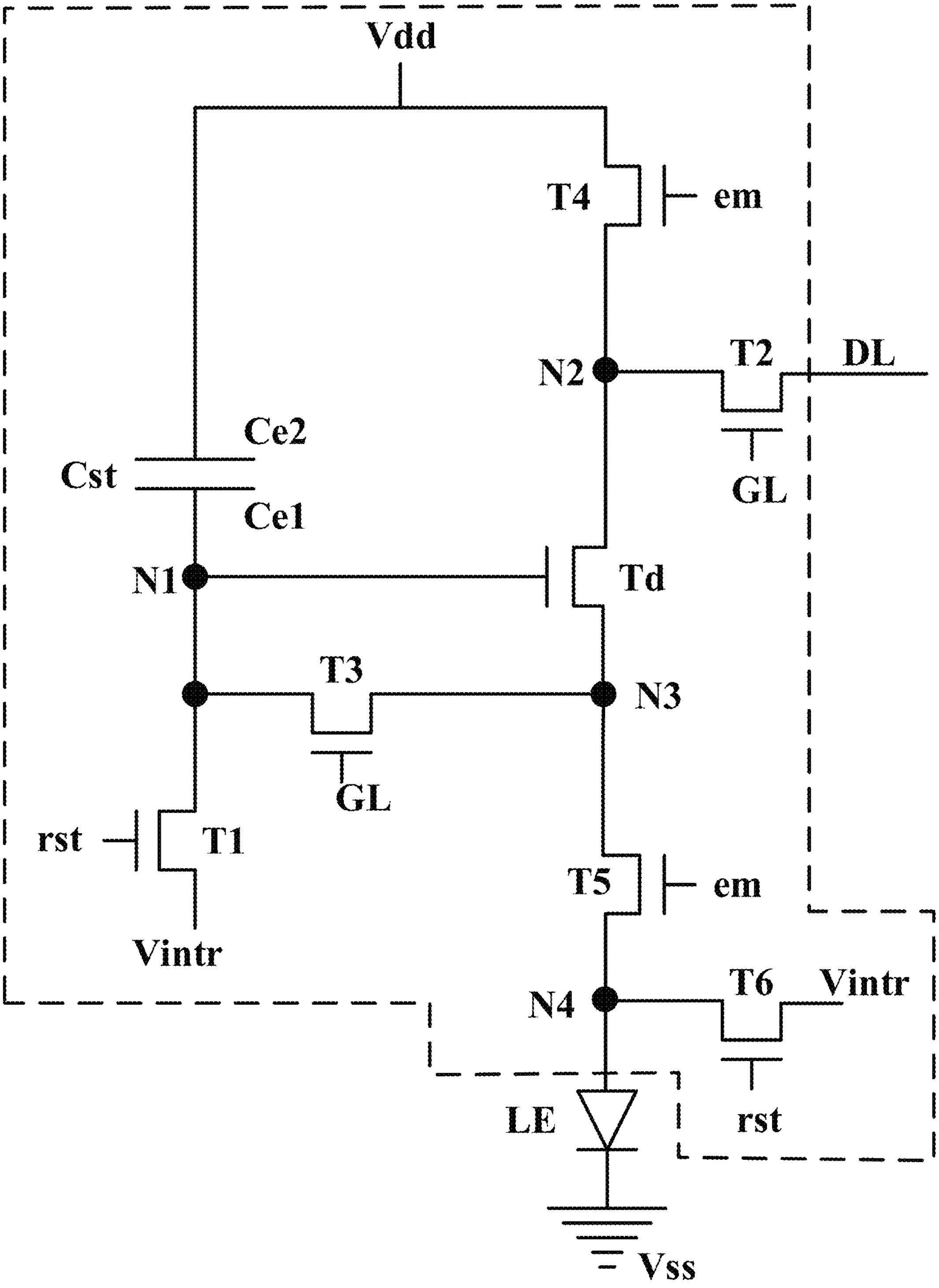
FIG. 14 is a circuit diagram illustrating the structure of a pixel driving circuit in some embodiments according to the present disclosure.

FIG. 14 is a circuit diagram illustrating the structure of a pixel driving circuit in some embodiments according to the present disclosure. FIG. 14 illustrates the structure of an exemplary pixel driving circuit. Referring to FIG. 14, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line of a plurality of reset control signal lines rst, a source electrode connected to a respective first reset signal line of a plurality of first reset signal lines Vintr, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; and a sixth transistor T6 having a gate electrode connected to the respective reset control signal line of the plurality of reset control signal lines rst, a source electrode connected to the respective first reset signal line of the plurality of first reset signal lines Vintr, and a drain electrode connected to the drain electrode of the fifth transistor and the anode of the light emitting element LE. The second capacitor electrode Ce2 is connected to the respective voltage supply line and the source electrode of the fourth transistor T4.

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5. The fourth node N4 is connected to the drain electrode of the fifth transistor T5, the drain electrode of the sixth transistor T6, and the anode of the light emitting element LE.

Figure 15:
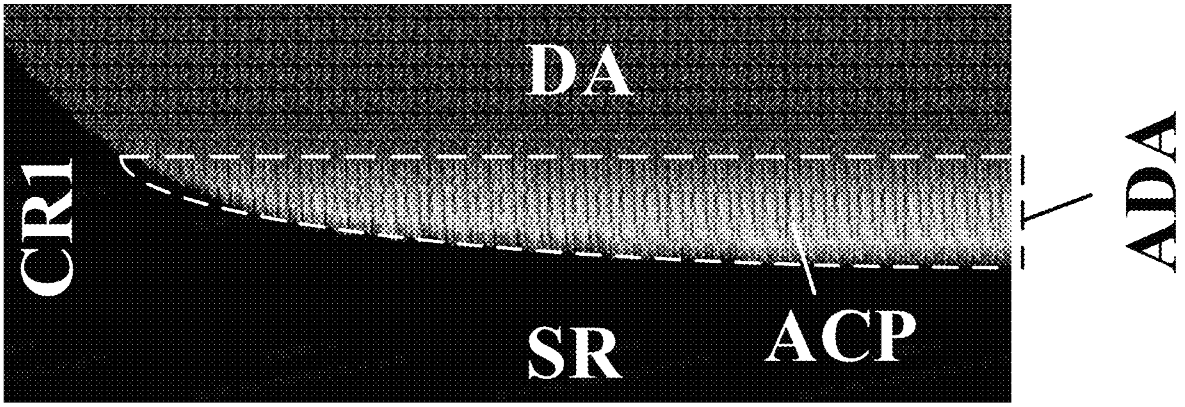
FIG. 15 shows an image of a region around a border between a display area and an additional display area in some embodiments according to the present disclosure.
Figure 16:
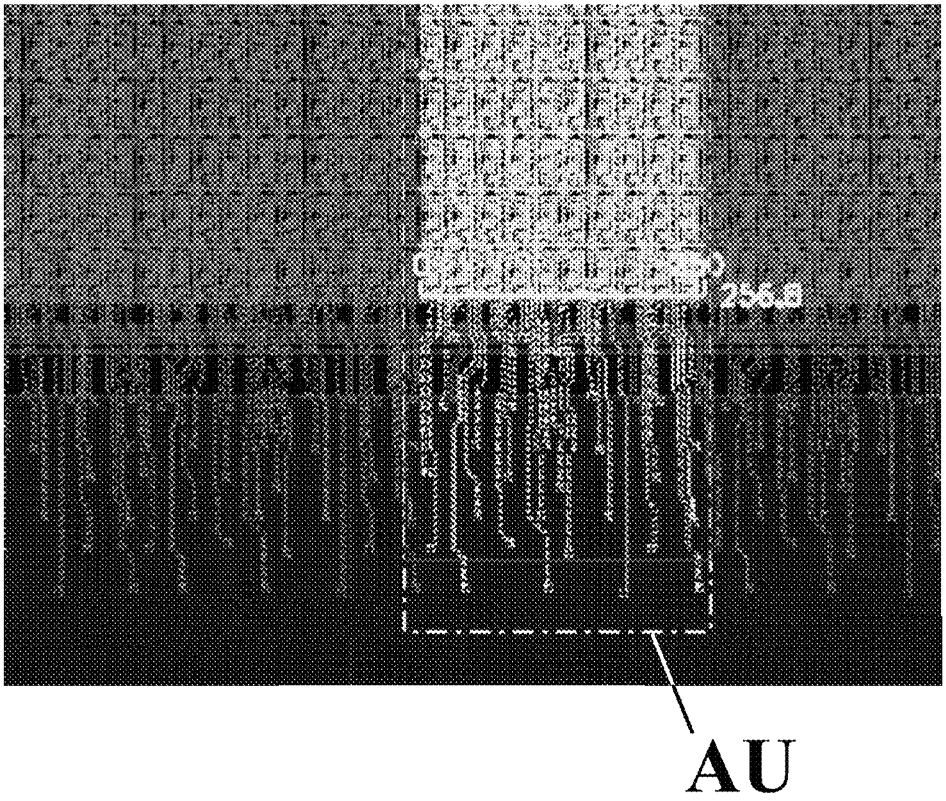
FIG. 16 is a zoom-in view of a region in FIG. 15.

FIG. 15 shows an image of a region around a border between a display area and an additional display area in some embodiments according to the present disclosure. As shown in FIG. 15, the additional display area ADA of the array substrate includes a plurality of anode connecting pads ACP. FIG. 16 is a zoom-in view of a region in FIG. 15. Referring to FIG. 15 and FIG. 16, the plurality of anode connecting pads ACP in some embodiments are grouped into multiple repeating units AU. At least two repeating units of the multiple repeating units AU corresponding to a same pixel driving circuit region of the plurality of pixel driving circuit regions (e.g., R in FIG. 11) have a same pattern, for example, the two repeating units have a substantially translational symmetry. Referring to FIG. 15, the plurality of anode connecting pads ACP in some embodiments are absent in the corner region (e.g., the first corner region CR1).

A respective one of the plurality of anode connecting pads ACP is connected to the drain electrode of the fifth transistor T5, the drain electrode of the sixth transistor T6, and the anode of the light emitting element LE. In some embodiments, the plurality of anode connecting pads ACP are in a layer different from the plurality of first connecting lines Cln1. Optionally, the plurality of anode connecting pads ACP are in a layer different from at least one of the first peripheral voltage supply line PVdd1, the plurality of second peripheral voltage supply lines PVdd2, the plurality of first connecting lines Cln1, or the plurality of voltage supply line Vdd. Optionally, the plurality of anode connecting pads ACP are in a layer different from the first peripheral voltage supply line PVdd1, the plurality of second peripheral voltage supply lines PVdd2, the plurality of first connecting lines Cln1, and the plurality of voltage supply line Vdd. Optionally, the plurality of anode connecting pads ACP are in an anode connecting pad layer (e.g., ACPL in FIG. 2). Optionally, the plurality of first connecting lines Cln1 are in a second signal line layer (e.g., SLL2 in FIG. 2). Optionally, the first peripheral voltage supply line PVdd1, the plurality of second peripheral voltage supply lines PVdd2, and the plurality of voltage supply line Vdd are in a first signal line layer (e.g., SLL1 in FIG. 2).

The plurality of first connecting lines Cln1 may be disposed in various appropriate layers. In one example, the plurality of first connecting lines Cln1 are in a light shield layer (e.g., LSL in FIG. 2). In another example, the plurality of first connecting lines Cln1 are in a first signal line layer. In another example, the plurality of first connecting lines Cln1 are in the anode connecting pad layer (e.g., ACPL in FIG. 2). When the plurality of first connecting lines Cln1 and the plurality of anode connecting pads ACP are both in the anode connecting pad layer, each first connecting line is insulated from adjacent anode connecting pads, and each anode connecting pad is insulated from adjacent first connecting lines.

The plurality of first connecting lines Cln1 may have various appropriate shapes. Referring to FIG. 12, a respective first connecting line of the plurality of first connecting lines Cln1 is connected to one or more second peripheral voltage supply lines of the plurality of second peripheral voltage supply lines PVdd2 through one or more first vias v1 extending through at least an insulating layer (e.g., a first planarization layer PLN1 in FIG. 2). The respective first connecting line of the plurality of first connecting lines Cln1 is connected to the first peripheral voltage supply line PVdd1 through one or more second vias v2 extending through at least the insulating layer. In one example, the respective first connecting line may have a zig-zag shape.

Figure 17A:
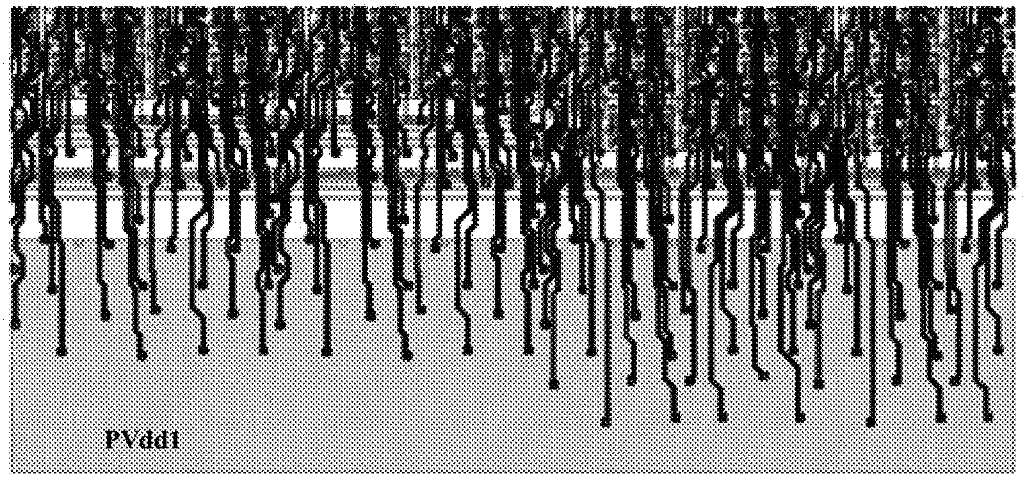
FIG. 17A shows an image of several layers in a region around a border between a display area and an additional display area in some embodiments according to the present disclosure.
Figure 17B:
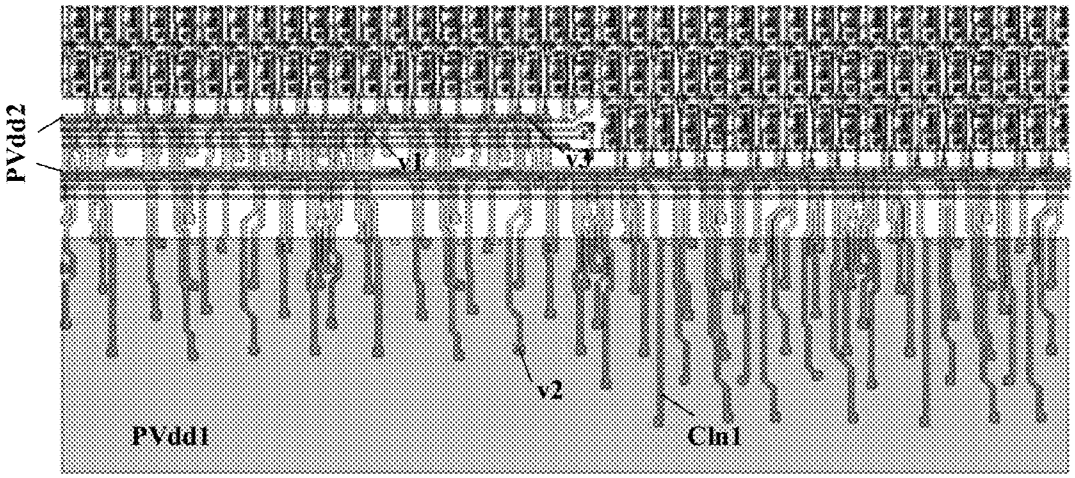
FIG. 17B illustrates the structure of a first signal line layer and a second signal line layer in the array substrate depicted in FIG. 17A.
Figure 17C:
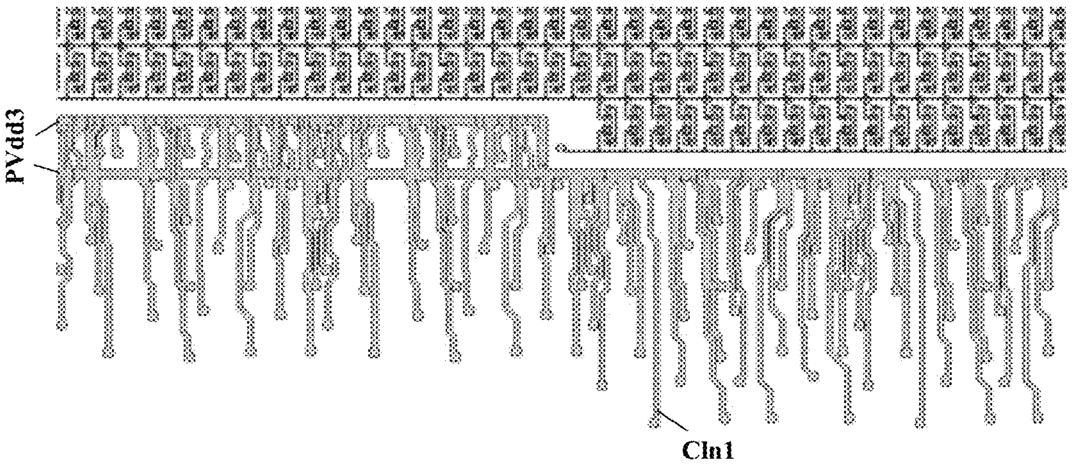
FIG. 17C illustrates the structure of a second signal line layer in the array substrate depicted in FIG. 17A.

FIG. 17A shows an image of several layers in a region around a border between a display area and an additional display area in some embodiments according to the present disclosure. FIG. 17B illustrates the structure of a first signal line layer and a second signal line layer in the array substrate depicted in FIG. 17A. FIG. 17C illustrates the structure of a second signal line layer in the array substrate depicted in FIG. 17A. Referring to FIG. 17A to FIG. 17C, the electrical connecting structure in some embodiments includes a plurality of first connecting lines Cln1 and a plurality of third peripheral voltage supply lines PVdd3. The plurality of first connecting lines Cln1 and the plurality of third peripheral voltage supply lines PVdd3 interconnect with each other. A respective first connecting line of the plurality of first connecting lines Cln1 is connected to the first peripheral voltage supply line PVdd1 through one or more second vias v2 extending through at least an insulating layer. A respective third peripheral voltage supply line of the plurality of third peripheral voltage supply lines PVdd3 is connected to a respective second peripheral voltage supply line of the plurality of second peripheral voltage supply lines PVdd2 through one or more third vias v3 extending through at least the insulating layer. Optionally, a respective first connecting line of the plurality of first connecting lines Cln1 is connected to one or more second peripheral voltage supply lines of the plurality of second peripheral voltage supply lines PVdd2 through one or more first vias v1 extending through at least the insulating layer.

In some embodiments, an orthographic projection of the plurality of third peripheral voltage supply lines PVdd3 on a base substrate at least partially (e.g., at least 50%, at least 60%, at least 70%, at least 80%, at least 90%, at least 95%, at least 98%, at least 99%, or 100%) overlaps with an orthographic projection of the plurality of second peripheral voltage supply lines PVdd2 on the base substrate. Optionally, the orthographic projection of the plurality of third peripheral voltage supply lines PVdd3 on the base substrate covers the orthographic projection of the plurality of second peripheral voltage supply lines PVdd2 on the base substrate.

Figure 17D:
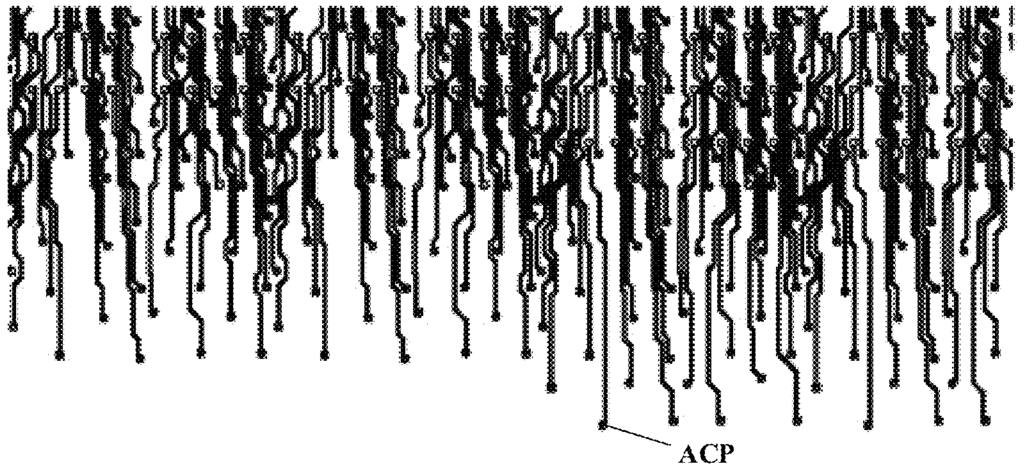
FIG. 17D illustrates the structure of an anode connecting pad layer in the array substrate depicted in FIG. 17A.
Figure 17E:
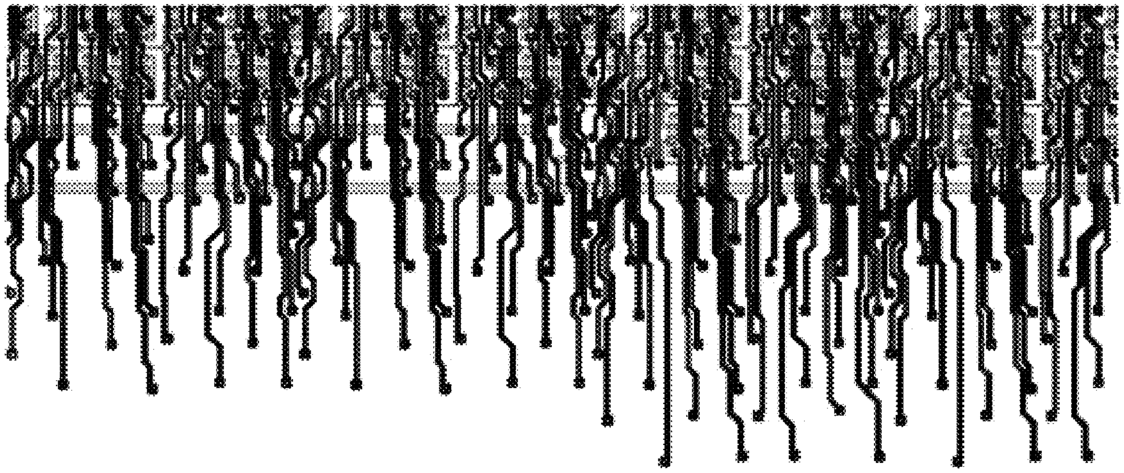
FIG. 17E illustrates the structure of a second signal line layer and an anode connecting pad layer in the array substrate depicted in FIG. 17A.

FIG. 17D illustrates the structure of an anode connecting pad layer in the array substrate depicted in FIG. 17A. FIG. 17E illustrates the structure of a second signal line layer and an anode connecting pad layer in the array substrate depicted in FIG. 17A. Referring to FIG. 17A, FIG. 17D, and FIG. 17E, in some embodiments, an orthographic projection of the plurality of anode connecting pads ACP on a base substrate at least partially (e.g., at least 50%, at least 60%, at least 70%, at least 80%, at least 90%, at least 95%, at least 98%, at least 99%, or 100%) overlaps with an orthographic projection of the plurality of first connecting lines Cln1 on the base substrate. Optionally, the orthographic projection of the plurality of anode connecting pads ACP on the base substrate covers the orthographic projection of the plurality of first connecting lines Cln1 on the base substrate.

Figure 18A:
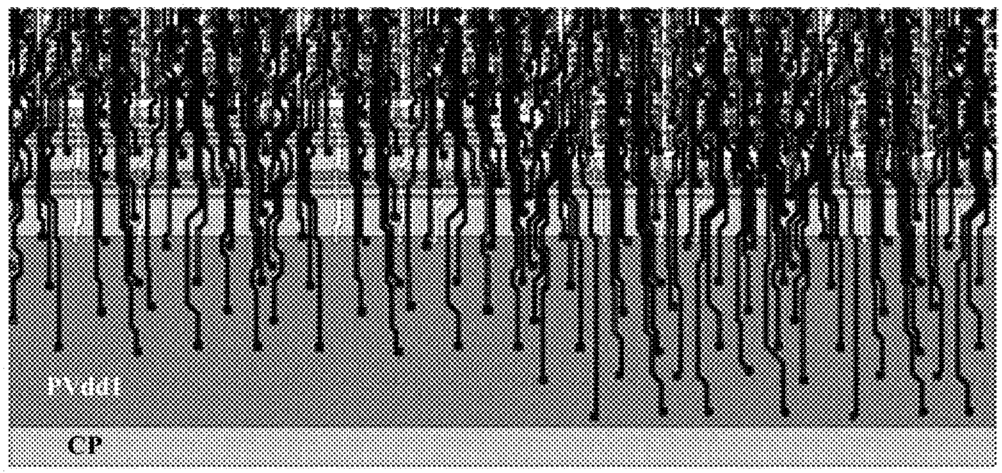
FIG. 18A shows an image of several layers in a region around a border between a display area and an additional display area in some embodiments according to the present disclosure.
Figure 18B:
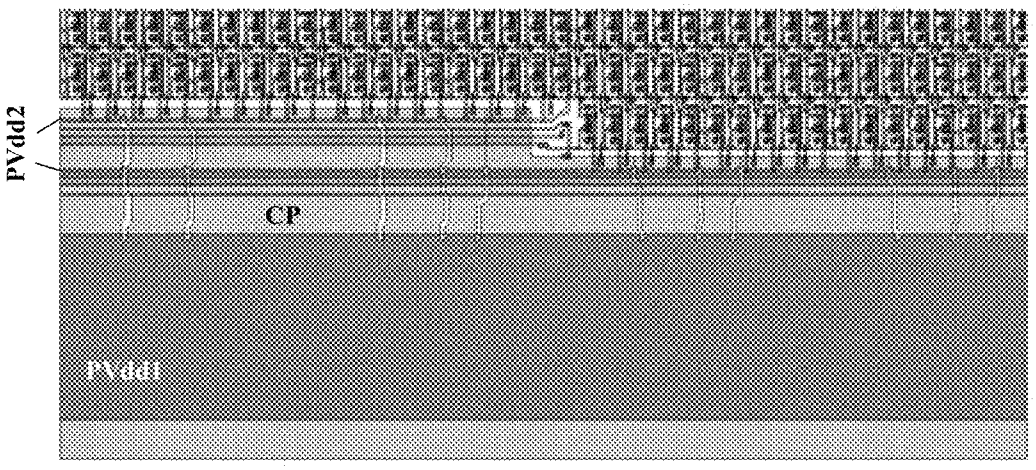
FIG. 18B illustrates the structure of a first signal line layer and a second signal line layer in the array substrate depicted in FIG. 18A.
Figure 18C:
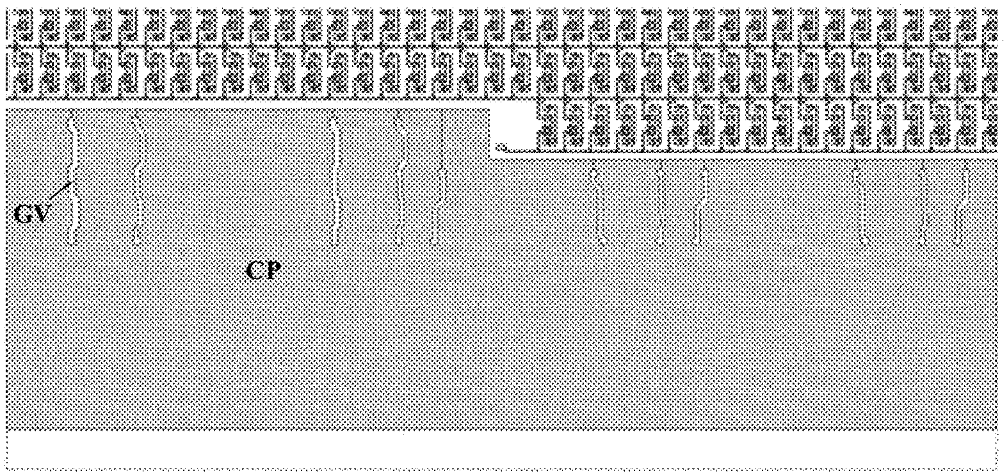
FIG. 18C illustrates the structure of a second signal line layer in the array substrate depicted in FIG. 18A.

FIG. 18A shows an image of several layers in a region around a border between a display area and an additional display area in some embodiments according to the present disclosure. FIG. 18B illustrates the structure of a first signal line layer and a second signal line layer in the array substrate depicted in FIG. 18A. FIG. 18C illustrates the structure of a second signal line layer in the array substrate depicted in FIG. 18A. Referring to FIG. 18A to FIG. 18C, the electrical connecting structure in some embodiments includes a connecting plate CP. In one example, the connecting plate CP is in the second signal line layer (e.g., SLL2 in FIG. 2) whereas the first peripheral voltage supply line PVdd1 and the plurality of second peripheral voltage supply lines PVdd2 are in the first signal line layer (e.g., SLL1 in FIG. 2). In another example, the connecting plate CP is in direct contact with the first peripheral voltage supply line PVdd1 and the plurality of second peripheral voltage supply lines PVdd2. For example, the array substrate is absent of any insulating layer between the connecting plate CP and the first peripheral voltage supply line PVdd1, and is absent of any insulating layer between the connecting plate CP and the plurality of second peripheral voltage supply lines PVdd2.

Optionally, an orthographic projection of the connecting plate CP on the base substrate at least partially (e.g., at least 50%, at least 60%, at least 70%, at least 80%, at least 90%, at least 95%, at least 98%, at least 99%, or 100%) overlaps with an orthographic projection of the first peripheral voltage supply line PVdd1 on the base substrate.

Optionally, an orthographic projection of the connecting plate CP on the base substrate at least partially (e.g., at least 50%, at least 60%, at least 70%, at least 80%, at least 90%, at least 95%, at least 98%, at least 99%, or 100%) overlaps with an orthographic projection of the plurality of second peripheral voltage supply lines PVdd2 on the base substrate.

Optionally, the connecting plate CP crosses over, along the first direction, at least one of the plurality of second peripheral voltage supply lines PVdd2, for example, the connecting plate CP crosses over, along the first direction, all of the plurality of second peripheral voltage supply lines PVdd2.

Figure 18D:
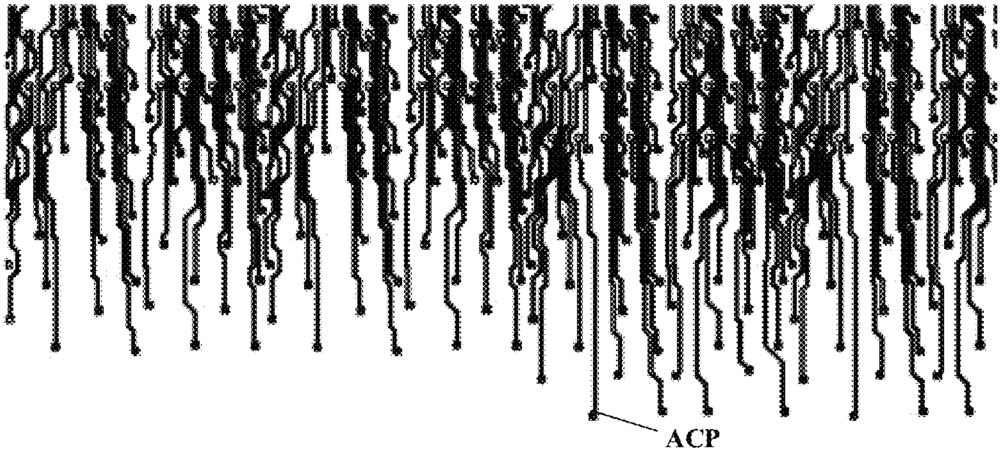
FIG. 18D illustrates the structure of an anode connecting pad layer in the array substrate depicted in FIG. 18A.
Figure 18E:
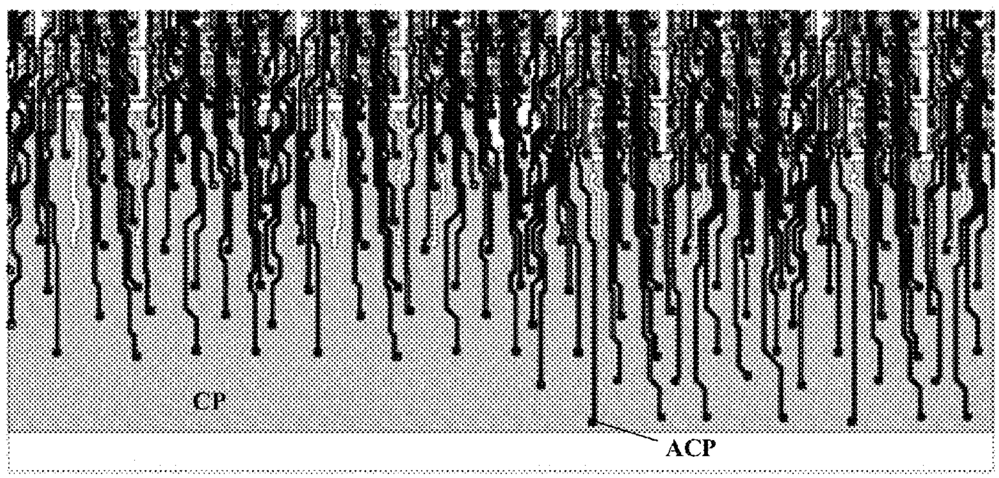
FIG. 18E illustrates the structure of a second signal line layer and an anode connecting pad layer in the array substrate depicted in FIG. 18A.

FIG. 18D illustrates the structure of an anode connecting pad layer in the array substrate depicted in FIG. 18A. FIG. 18E illustrates the structure of a second signal line layer and an anode connecting pad layer in the array substrate depicted in FIG. 18A. Referring to FIG. 18D and FIG. 18E, in some embodiments, an orthographic projection of the connecting plate CP on the base substrate at least partially (e.g., at least 50%, at least 60%, at least 70%, at least 80%, at least 90%, at least 95%, at least 98%, at least 99%, or 100%) overlaps with an orthographic projection of the plurality of anode connecting pads ACP on the base substrate.

In one example, the connecting plate CP is a unitary structure.

In another example, the connecting plate CP include multiple parts separated apart from each other, e.g., arranged along the second direction. A respective part of the multiple parts is in direct contact with the first peripheral voltage supply line PVdd1 and one or more of the plurality of second peripheral voltage supply lines PVdd2.

Referring to FIG. 18A to FIG. 18E, in some embodiments, the array substrate includes one or more grooves GV extending at least partially into (e.g., extending through) the connecting plate CP. At least one groove of the one or more grooves GV may be disposed in a region between two anode connecting pads of the plurality of anode connecting pads ACP that are directly adjacent to the groove, where an average distance between the two anode connecting pads is greater than an average value of average distances respectively between pairs of directly adjacent anode connecting pads of the plurality of anode connecting pads ACP. By having the one or more grooves GV, the plurality of anode connecting pads ACP can be fabricated to have a more uniform line width. For example, the one or more grooves GV may function to store excess etchant (as a solution during the etching process) in a process of etching a conductive material layer to form the plurality of anode connecting pads ACP, thereby preventing accumulation of the etchant in a portion of the array substrate.

In another example, the array substrate is absent of grooves in the connecting plate CP.

Figure 19A:
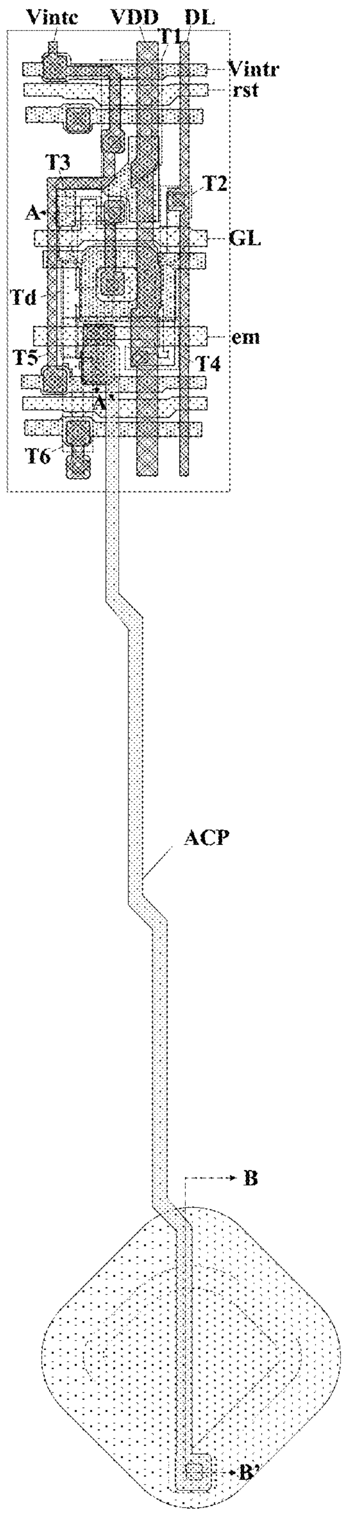
FIG. 19A illustrates the structure of a respective pixel driving circuit and a respective light emitting element in some embodiments according to the present disclosure.
Figure 19B:
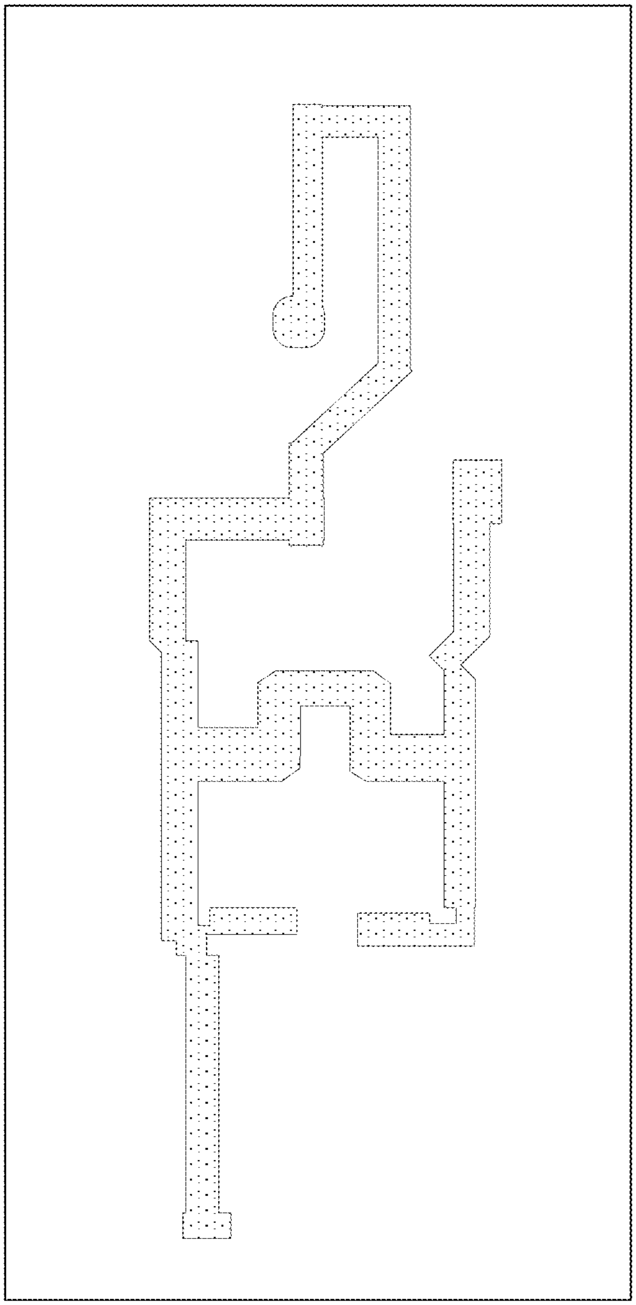
FIG. 19B illustrates the structure of a semiconductor material layer in an array substrate depicted in FIG. 19A.
Figure 19C:
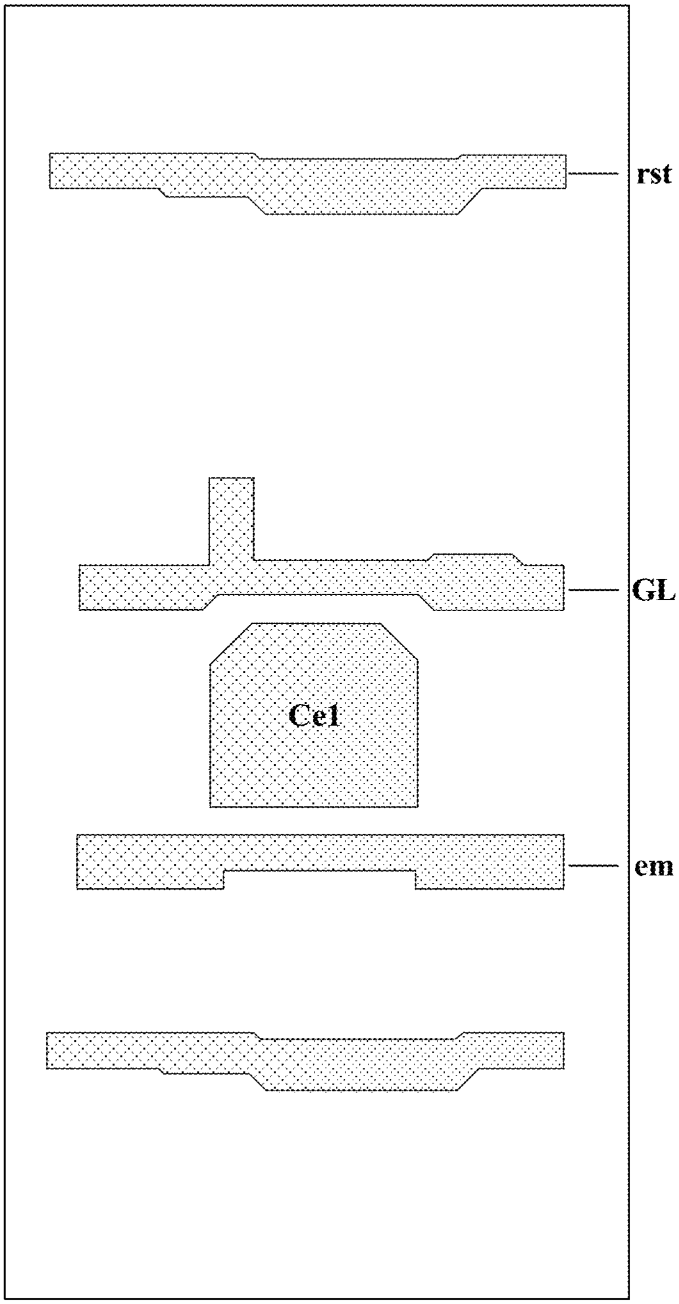
FIG. 19C illustrates the structure of a first conductive layer in an array substrate depicted in FIG. 19A.
Figure 19D:
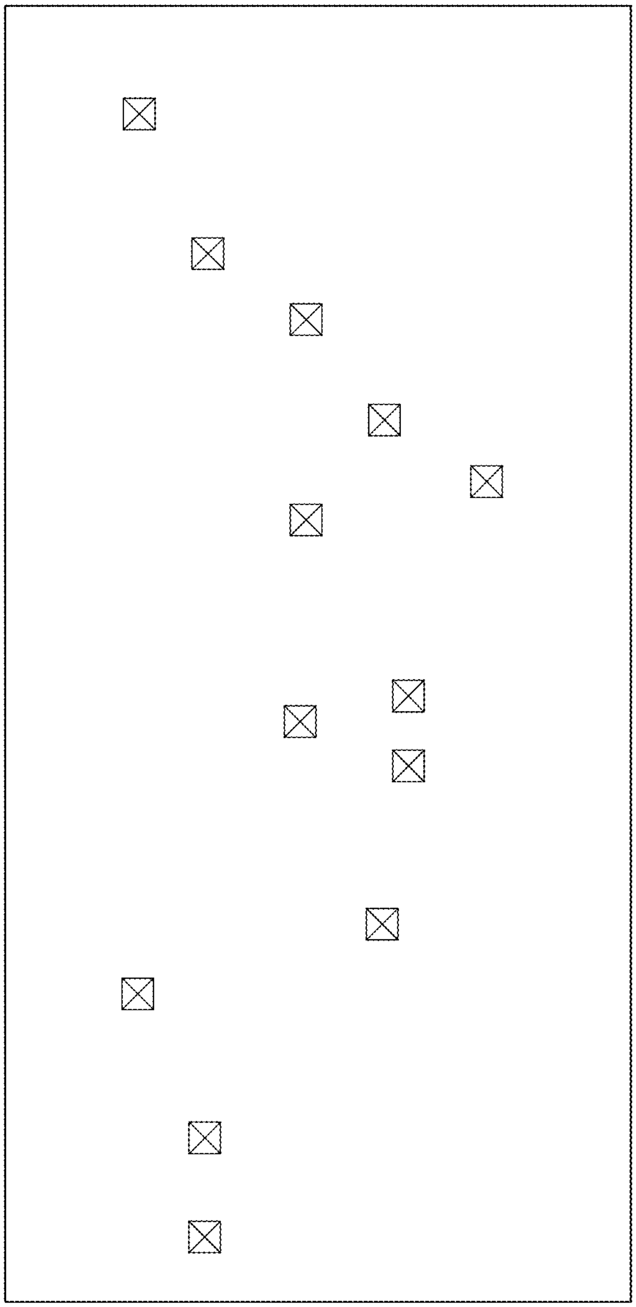
FIG. 19D illustrates the structure of an insulating layer in an array substrate depicted in FIG. 19A.
Figure 19E:
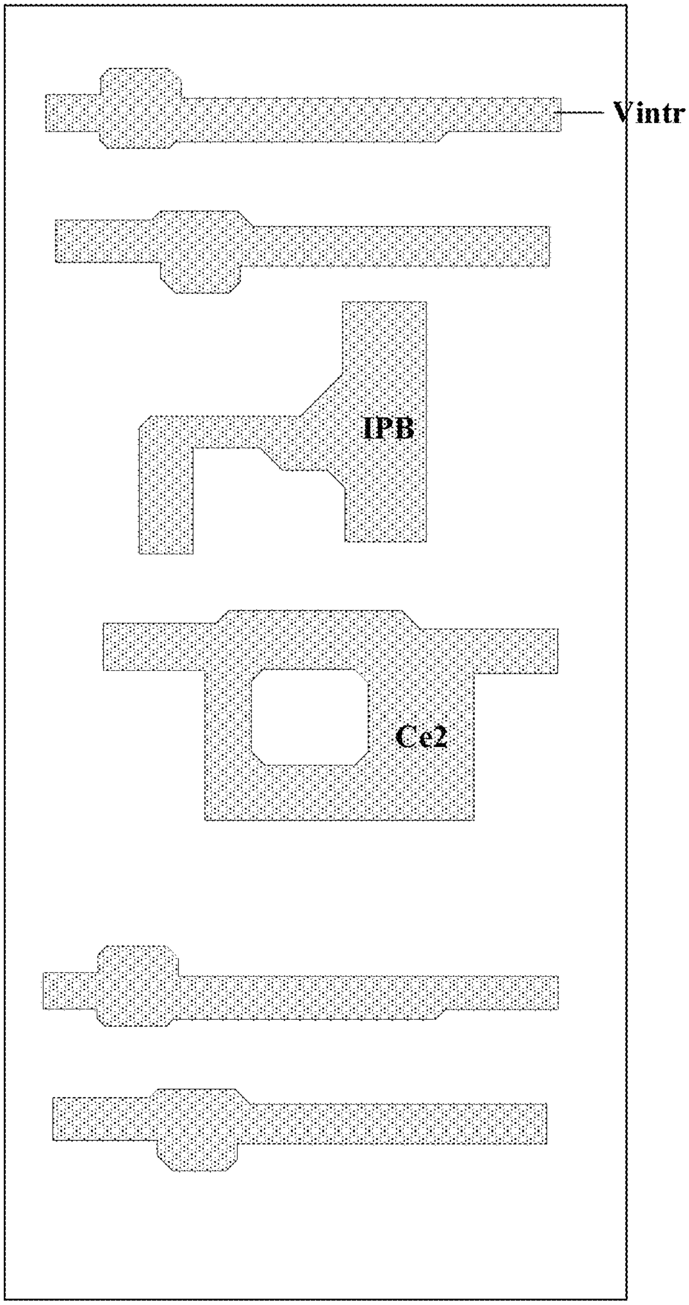
FIG. 19E illustrates the structure of a second conductive layer in an array substrate depicted in FIG. 19A.
Figure 19F:
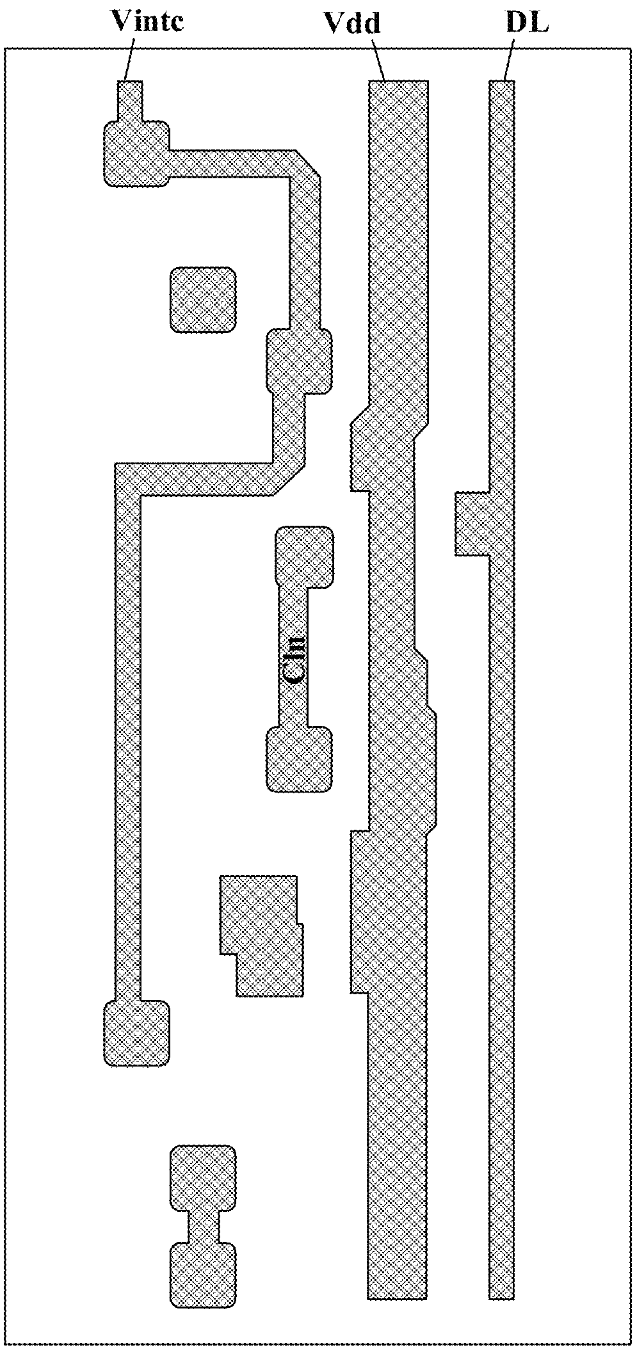
FIG. 19F illustrates the structure of a first signal line layer in an array substrate depicted in FIG. 19A.
Figure 19G:
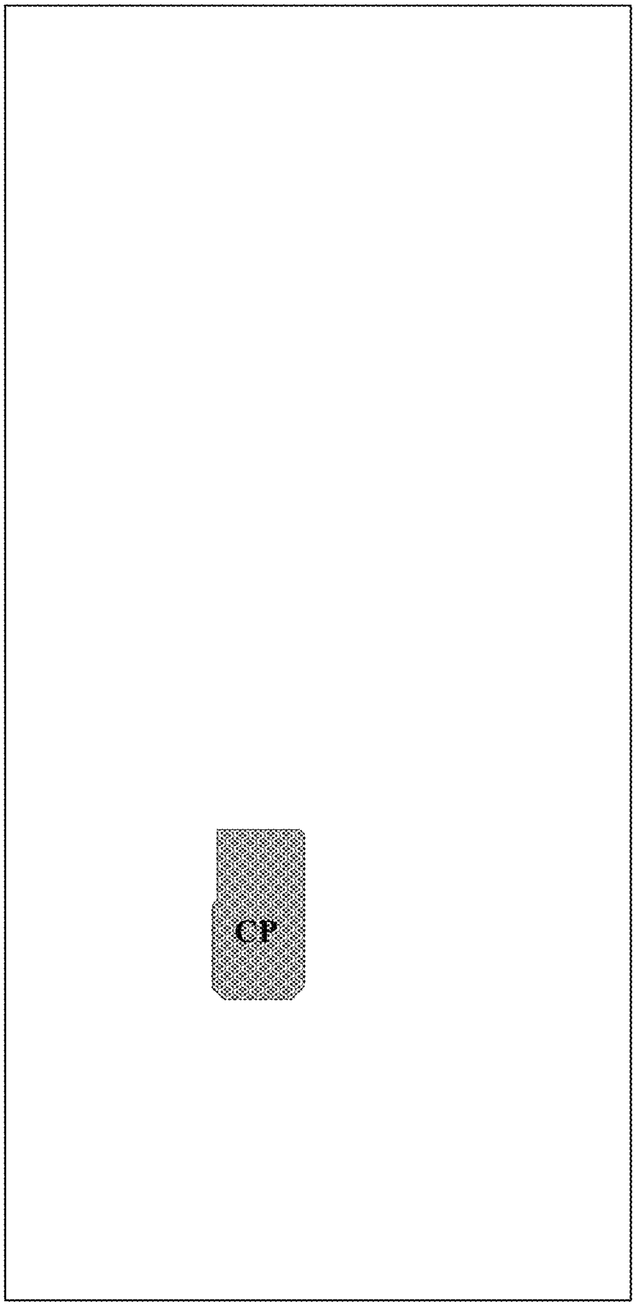
FIG. 19G illustrates the structure of a second signal line layer in an array substrate depicted in FIG. 19A.
Figure 19H:
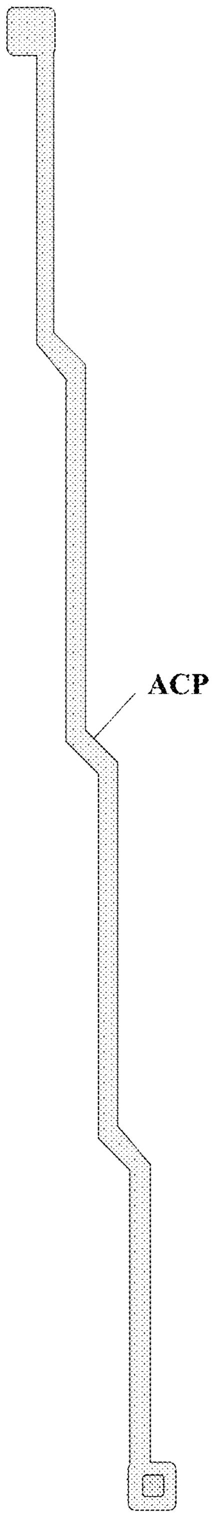
FIG. 19H illustrates the structure of an anode connecting pad layer in an array substrate depicted in FIG. 19A.
Figure 19I:
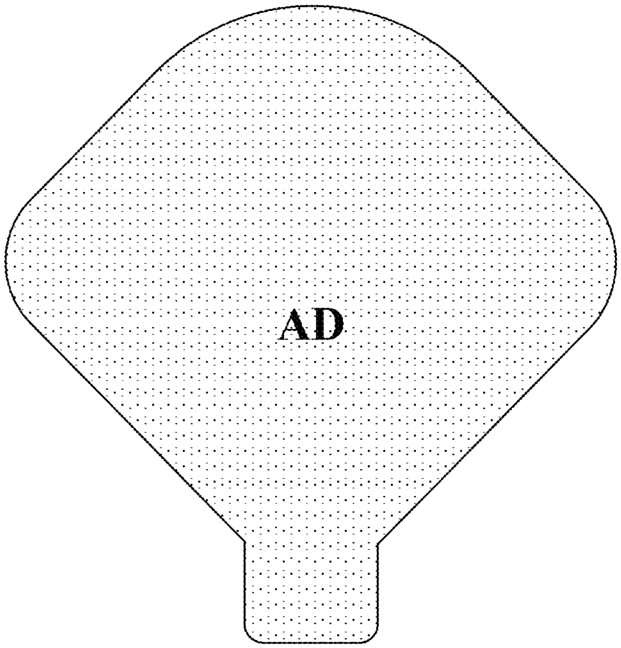
FIG. 19I illustrates the structure of an anode layer in an array substrate depicted in FIG. 19A.
Figure 19J:
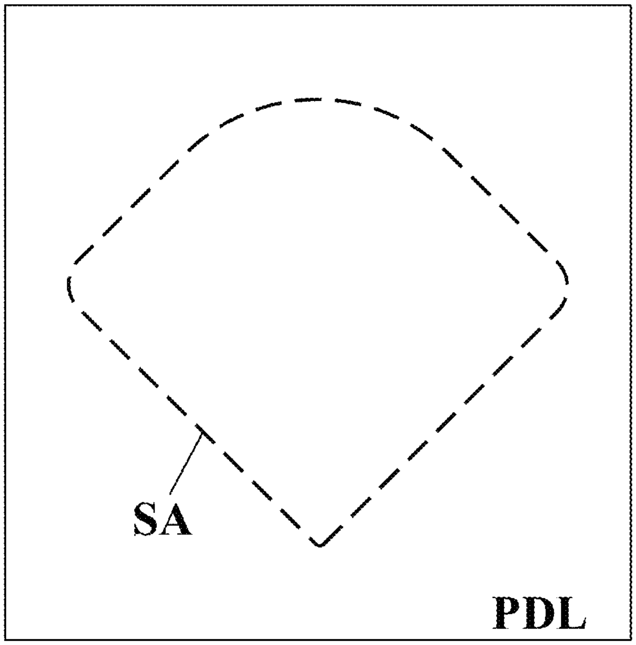
FIG. 19J illustrates the structure of a pixel definition layer in an array substrate depicted in FIG. 19A.
Figure 19K:
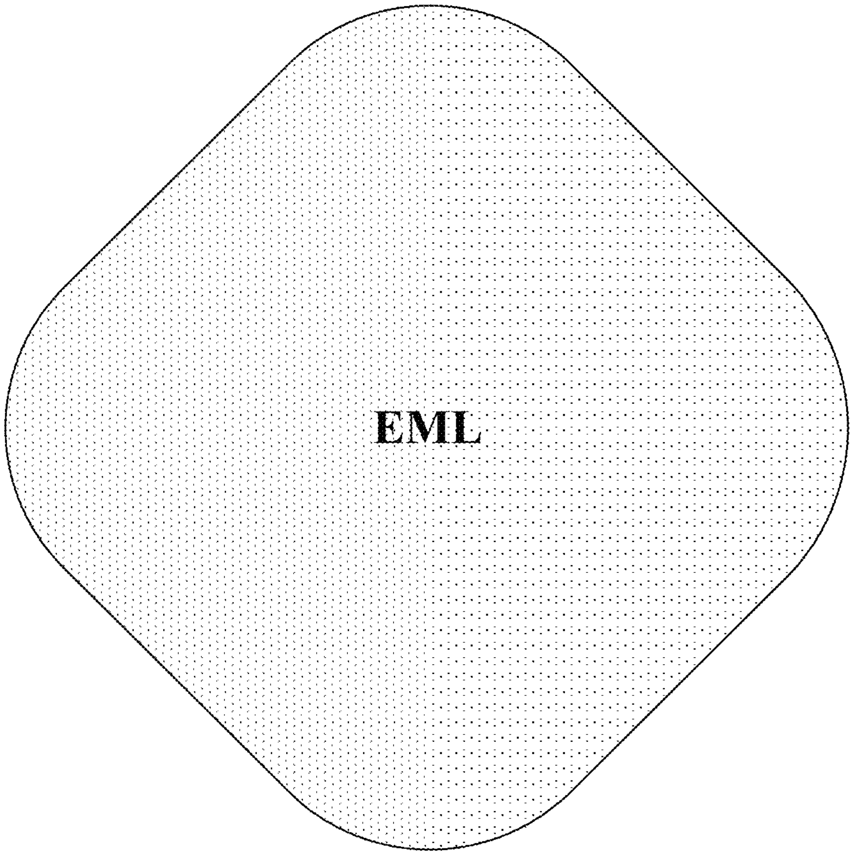
FIG. 19K illustrates the structure of a light emitting layer in an array substrate depicted in FIG. 19A.
Figure 20A:
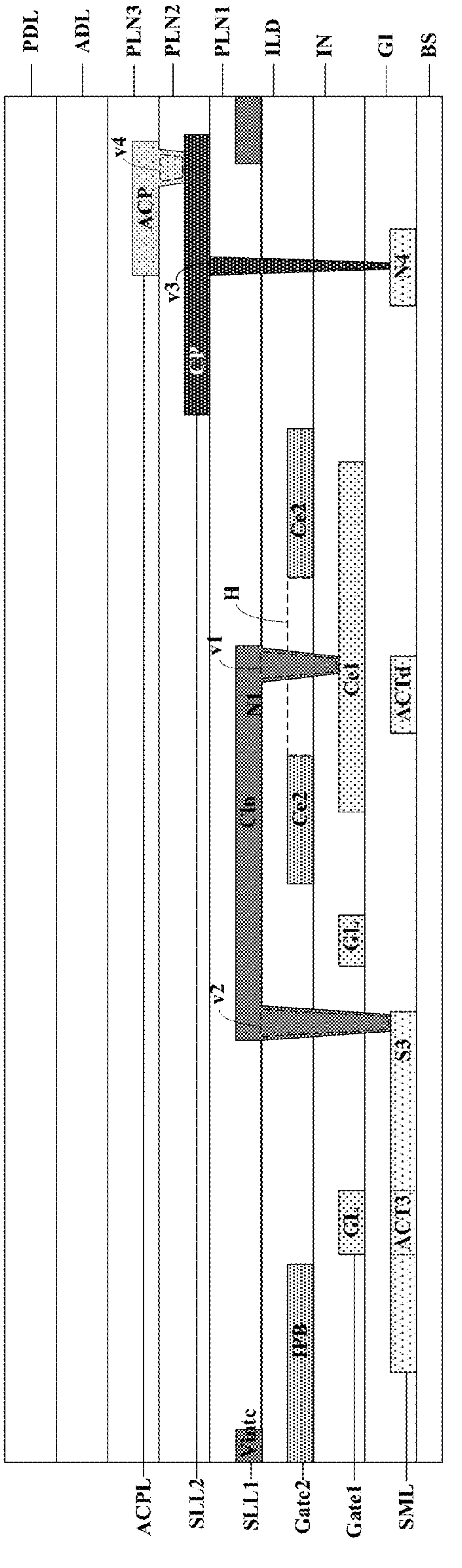
FIG. 20A is a cross-sectional view along an A-A' line in FIG. 19A.
Figure 20B:
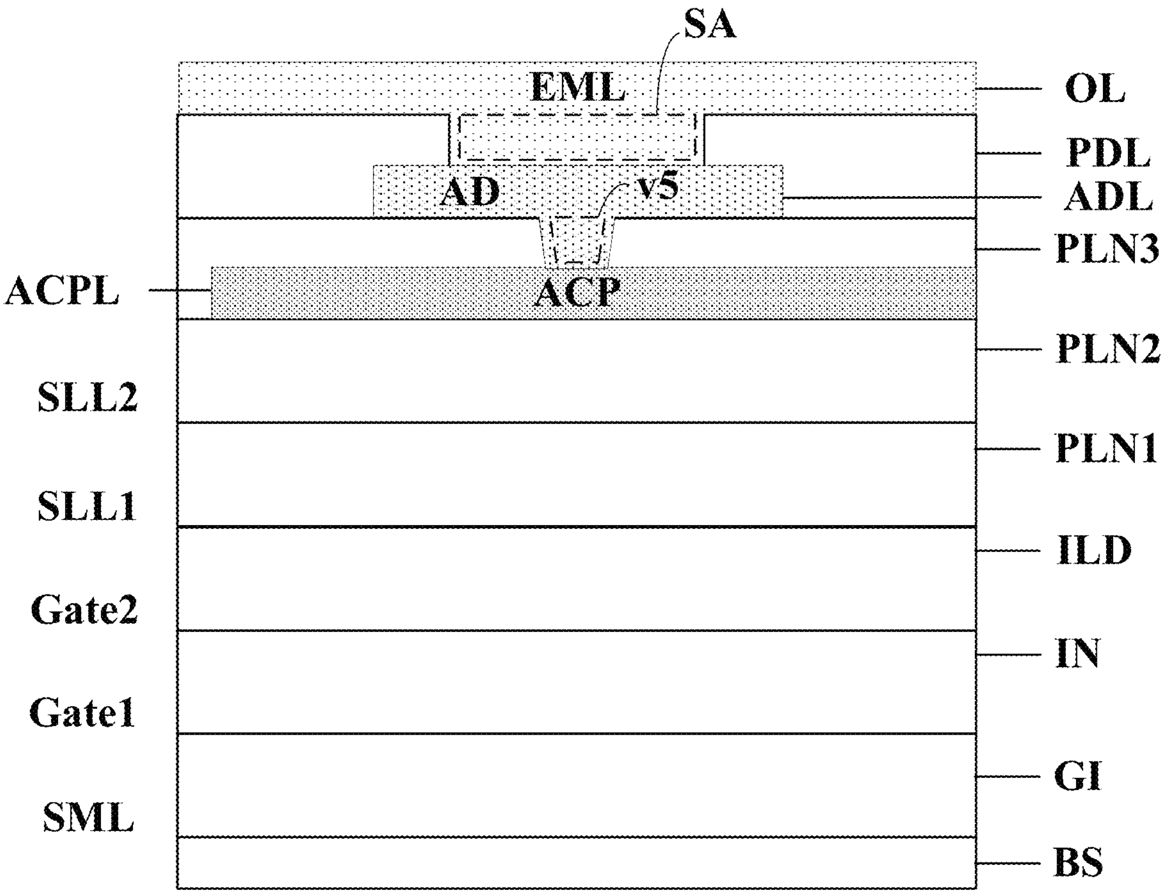
FIG. 20B is a cross-sectional view along a B-B' line in FIG. 19A.

FIG. 19A illustrates the structure of a respective pixel driving circuit and a respective light emitting element in some embodiments according to the present disclosure. FIG. 19B illustrates the structure of a semiconductor material layer in an array substrate depicted in FIG. 19A. FIG. 19C illustrates the structure of a first conductive layer in an array substrate depicted in FIG. 19A. FIG. 19D illustrates the structure of an insulating layer in an array substrate depicted in FIG. 19A. FIG. 19E illustrates the structure of a second conductive layer in an array substrate depicted in FIG. 19A. FIG. 19F illustrates the structure of a first signal line layer in an array substrate depicted in FIG. 19A. FIG. 19G illustrates the structure of a second signal line layer in an array substrate depicted in FIG. 19A. FIG. 19H illustrates the structure of an anode connecting pad layer in an array substrate depicted in FIG. 19A. FIG. 19I illustrates the structure of an anode layer in an array substrate depicted in FIG. 19A. FIG. 19J illustrates the structure of a pixel definition layer in an array substrate depicted in FIG. 19A. FIG. 19K illustrates the structure of a light emitting layer in an array substrate depicted in FIG. 19A. FIG. 20A is a cross-sectional view along an A-A' line in FIG. 19A. FIG. 20B is a cross-sectional view along a B-B' line in FIG. 19A.

Referring to FIG. 19A to FIG. 19K, FIG. 20A, and FIG. 20B, in some embodiments, the array substrate includes a base substrate BS, a semiconductor material layer SML on the base substrate BS, a gate insulating layer GI on a side of the semiconductor material layer SML away from the base substrate BS, a first conductive layer Gate1 on a side of the gate insulating layer GI away from the semiconductor material layer SML, an insulating layer IN on a side of the first conductive layer away from the gate insulating layer GI, a second conductive layer Gate2 on a side of the insulating layer IN away from the first conductive layer Gate1, an inter-layer dielectric layer ILD on a side of the second conductive layer Gate2 away from the insulating layer IN, a first signal line layer SLL1 on a side of the inter-layer dielectric layer ILD away from the second conductive layer Gate2, a first planarization layer PLN1 on a side of the first signal line layer SLL1 away from the inter-layer dielectric layer ILD, a second signal line layer SLL2 on a side of the first planarization layer PLN1 away from the first signal line layer SLL1, a second planarization layer PLN2 on a side of the second signal line layer SLL2 away from the first planarization layer PLN1, an anode connecting pad layer ACPL on a side of the second planarization layer PLN2 away from the second signal line layer SLL2, a third planarization layer PLN3 on a side of the anode connecting pad layer ACPL away from the second planarization layer PLN2, an anode layer ADL on a side of the third planarization layer PLN3 away from the anode connecting pad layer ACPL, a pixel definition layer PDL on a side of the anode layer ADL away from the third planarization layer PLN3, and a light emitting layer EML on a side of the pixel definition layer PDL away from the anode layer ADL.

Referring to FIG. 19A to FIG. 19K, the semiconductor material layer SML in some embodiments includes active layers of the transistors, including active layers of the first transistor T1, the second transistor T2, the third transistor T3, the fourth transistor T4, the fifth transistor T5, the sixth transistor T6, and the driving transistor Td. Various appropriate semiconductor materials may be used for making the semiconductor material layer SML. Examples of appropriate semiconductor materials for making the semiconductor material layer SML include polycrystalline silicon, amorphous silicon, and metal oxides.

The first conductive layer Gate1 in some embodiments includes a plurality of gate lines GL, a plurality of reset control signal lines rst, a plurality of light emitting control signal lines em, and a first capacitor electrode Ce1 of the storage capacitor Cst.

Vias extending through an insulating layer IN are depicted in FIG. 19D.

The second conductive layer Gate2 in some embodiments includes an interference preventing block IPB, a second capacitor electrode Ce2 of the storage capacitor Cst, and a plurality of first reset signal lines Vintr. The interference preventing block IPB can effectively reduce crosstalk, particularly vertical crosstalk between the N1 node and the adjacent data lines.

The first signal line layer SLL1 in some embodiments includes a plurality of voltage supply lines Vdd, a node connecting line Cln, a plurality of second reset signal lines Vintc, and a plurality of data lines DL. The node connecting line Cln connects the first capacitor electrode Ce1 and the drain electrode of the third transistor T3 in a respective pixel driving circuit together. The array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer GI away from the base substrate BS. Optionally, the array substrate further includes a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and is connected to the semiconductor material layer SML through the second via v2. Optionally, the node connecting line Cln is connected to the drain electrode D3 of third transistor, as depicted in FIG. 20A.

The second signal line layer SLL2 in some embodiments includes a connecting pad CP, through which the N4 node is electrically connected to an anode of the respective light emitting element. Optionally, the array substrate further includes a third via v3 extending through the first planarization layer PLN1, the inter-layer dielectric layer ILD, the insulating layer IN, and the gate insulating layer GI. The connecting pad CP is connected to the N4 node through the third via v3.

The anode connecting pad layer ACPL in some embodiments includes a plurality of anode connecting pads ACP. A respective anode connecting pad of the plurality of anode connecting pads ACP electrically connects the connecting pad CP to an anode of the respective light emitting element. Optionally, the array substrate further includes a fourth via v4 extending through the second planarization layer PLN2. A respective anode connecting pad of the plurality of anode connecting pads ACP is connected to the connecting pad CP through the fourth via v4. Various appropriate conductive materials may be used for making the plurality of anode connecting pads ACP. Examples of appropriate conductive materials for making the plurality of anode connecting pads ACP include conductive metal oxides such as indium tin oxide.

The anode layer includes a plurality of anodes AD of a plurality of light emitting elements, respectively. A respective anode of the plurality of anodes AD is connected to a respective connecting line. Optionally, the array substrate further includes a fifth via v5 extending through the third planarization layer PLN3. The respective anode is connected to the respective connecting line through the fifth via v5.

The pixel definition layer PDL defines a plurality of subpixel apertures SA.

The light emitting layer in some embodiments includes a plurality of light emitting layer EML of a plurality of light emitting elements, respectively. A respective light emitting layer of the plurality of light emitting layer EML is electrically connected to a respective anode of the plurality of anodes AD.

The plurality of anode connecting pads ACP may be disposed in various appropriate layers. In some embodiments, the plurality of anode connecting pads ACP are all in a same layer. In some embodiments, the plurality of anode connecting pads ACP may be disposed in multiple layers. In one example, two adjacent anode connecting pads extending substantially along the column direction may be disposed in two different layers.

In one example, the plurality of anode connecting pads ACP are in an anode connecting pad layer ACPL; the second planarization layer PLN2 is on a side of the anode connecting pad layer ACPL closer to a base substrate BS; the third planarization layer PLN3 is on a side of the anode connecting pad layer ACPL away from the base substrate BS; the anode layer ADL is on a side of the third planarization layer PLN3 away from the anode connecting pad layer ACPL; and the plurality of pixel driving circuits PDC are on a side of the second planarization layer PLN2 away from the anode connecting pad layer ACPL.

Figure 21A:
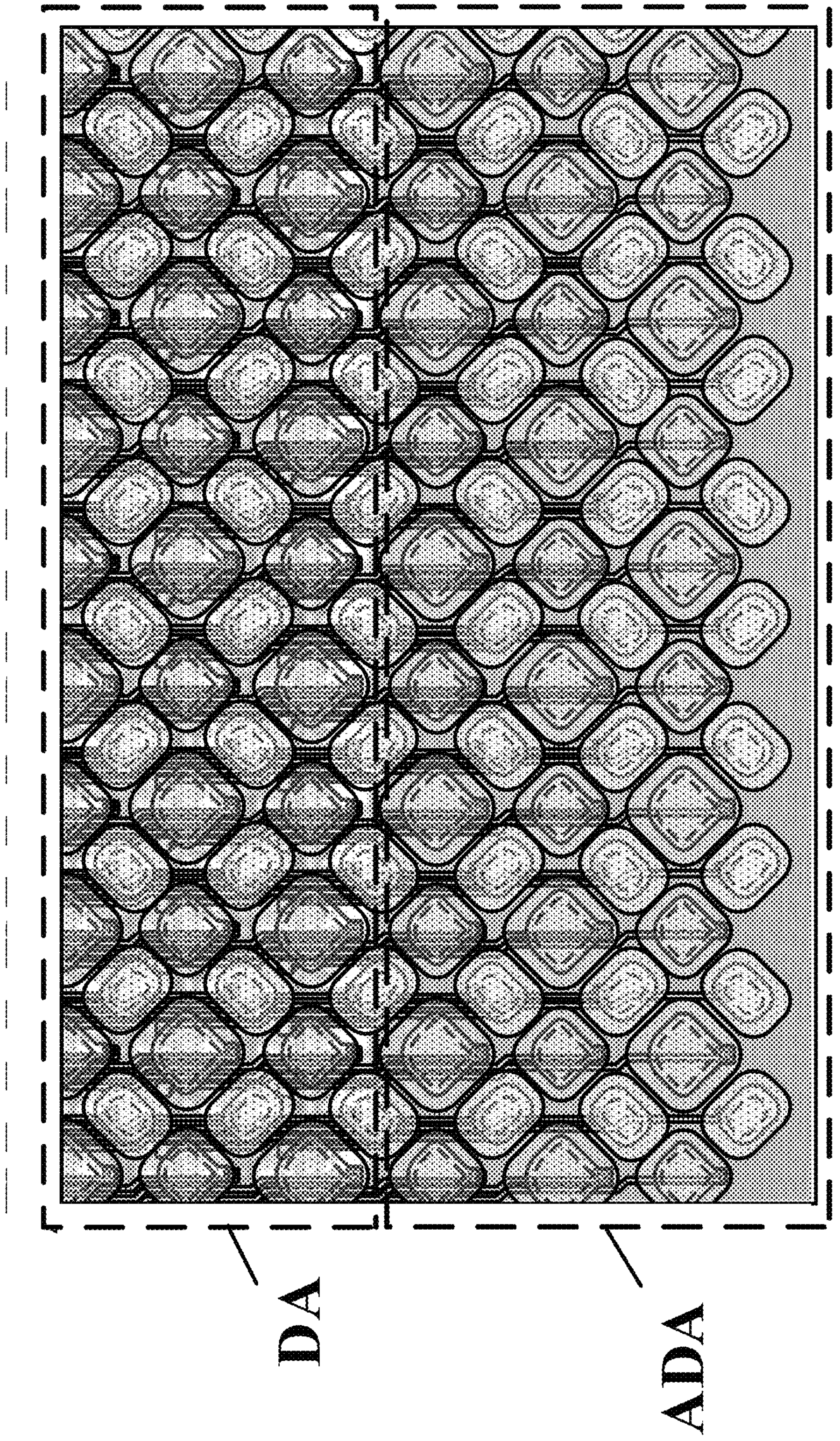
FIG. 21A illustrates the structure of an array substrate in a second region in some embodiments according to the present disclosure.
Figure 21B:
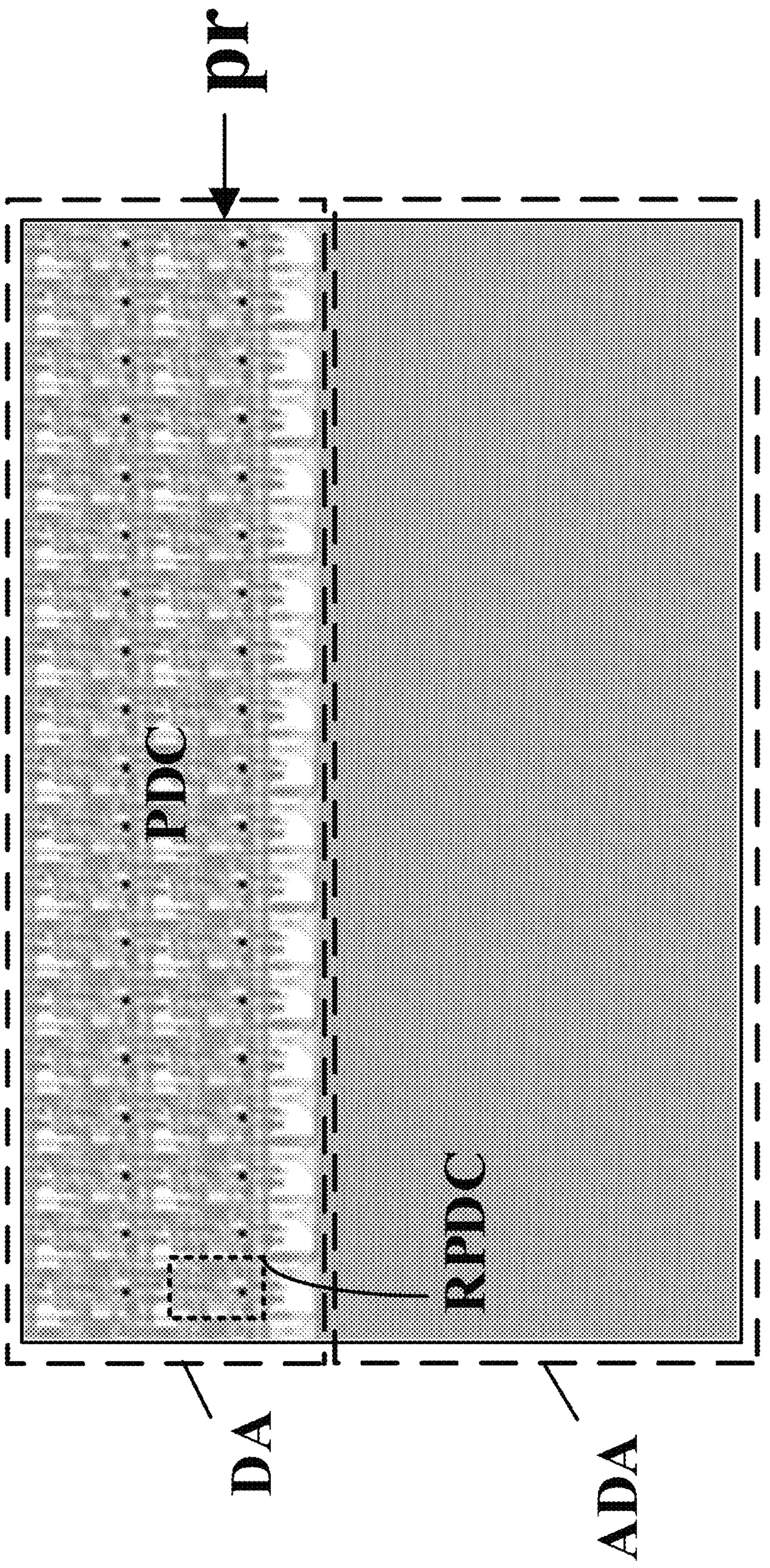
FIG. 21B illustrates the structure of pixel driving circuits in FIG. 21A.
Figure 21C:
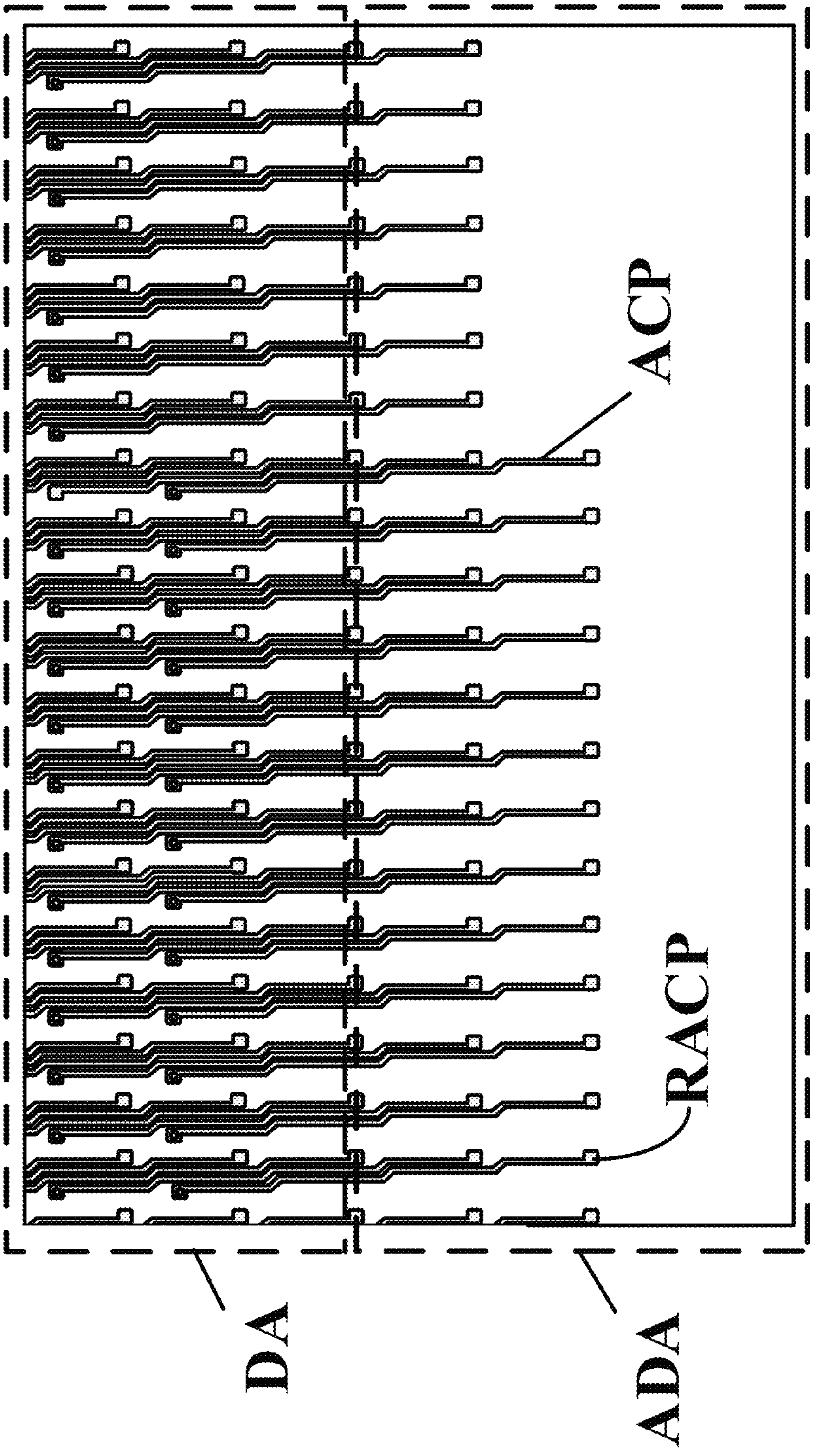
FIG. 21C illustrates the structure of connecting lines in FIG. 21A.
Figure 21D:
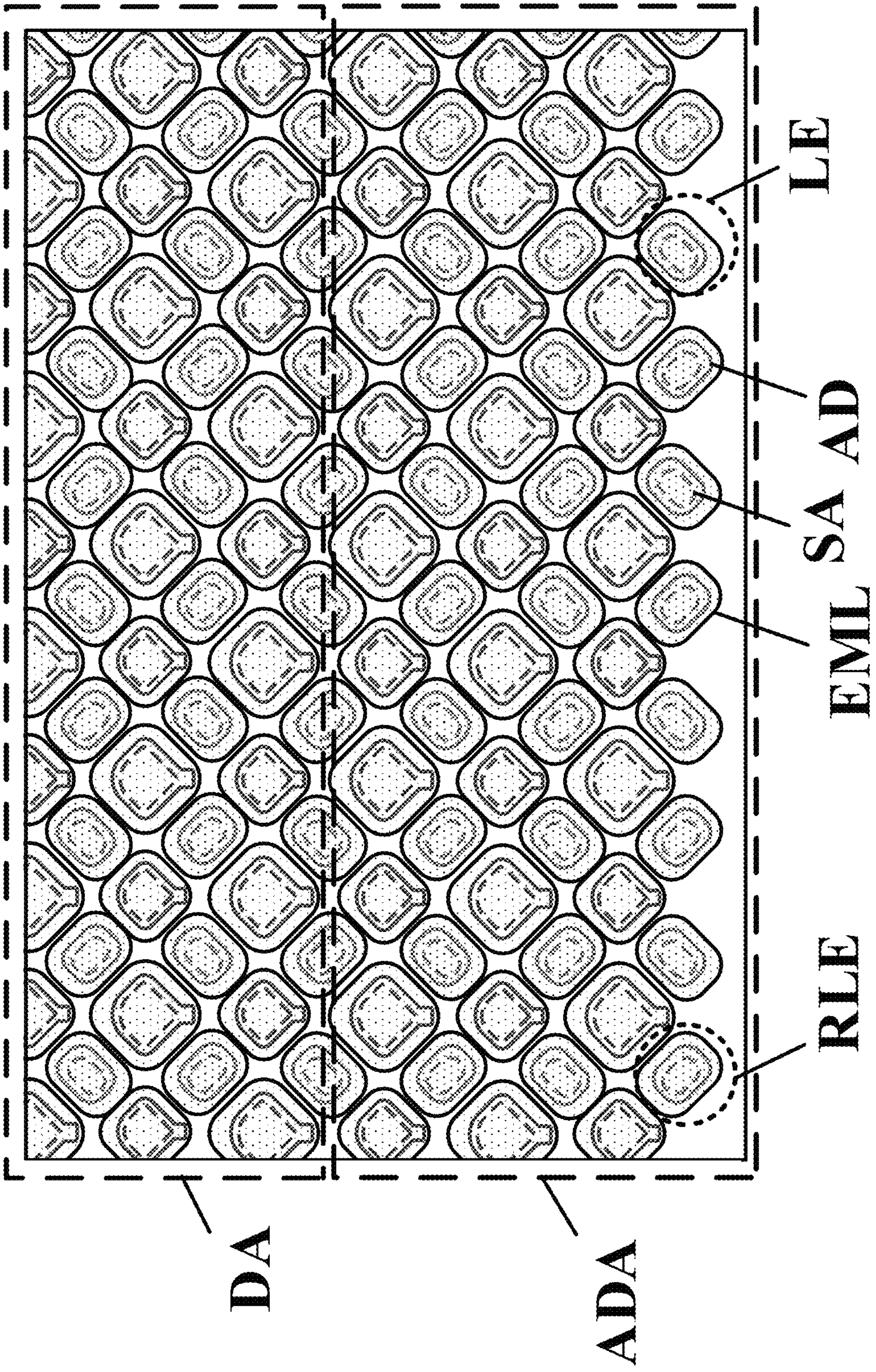
FIG. 21D illustrates the structure of light emitting elements in FIG. 21A.

FIG. 21A illustrates the structure of an array substrate in a second region in some embodiments according to the present disclosure. FIG. 21B illustrates the structure of pixel driving circuits in FIG. 21A. FIG. 21C illustrates the structure of connecting lines in FIG. 21A. FIG. 21D illustrates the structure of light emitting elements in FIG. 21A. Referring to FIG. 21A to FIG. 21D, in the additional display area ADA, multiple light emitting elements of a plurality of light emitting elements LE are present, and transistors and capacitors of the plurality of pixel driving circuits PDC are absent. Optionally, in the additional display area ADA, at least one row of light emitting elements are present, and transistors and capacitors of the plurality of pixel driving circuits PDC are absent. Optionally, in the display area DA, multiple rows of light emitting elements and transistors and capacitors of multiple rows of pixel driving circuits are present.

In some embodiments, the plurality of anode connecting pads ACP connect the plurality of pixel driving circuits PDC with a plurality of corresponding light emitting elements, respectively. A respective anode connecting pad RACP connects a respective pixel driving circuit RPDC with a respective light emitting element RLE.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present invention provides a method of fabricating an array substrate. In some embodiments, the method includes forming a voltage supply network. Optionally, forming the voltage supply network includes, in a corner region of a peripheral area, forming a first peripheral voltage supply line; forming a plurality of second peripheral voltage supply lines; and forming an electrical connecting structure configured to connect the plurality of second peripheral voltage supply lines with the first peripheral voltage supply line. Optionally, the electrical connecting structure crosses over at least one of the plurality of second peripheral voltage supply lines.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a voltage supply network;

wherein the voltage supply network comprises, in a corner region of a peripheral area:

a first peripheral voltage supply line;

a plurality of second peripheral voltage supply lines; and an electrical connecting structure configured to connect the plurality of second peripheral voltage supply lines with the first peripheral voltage supply line;

wherein the electrical connecting structure crosses over at least one of the plurality of second peripheral voltage supply lines;

wherein the electrical connecting structure comprises a connecting plate; and the connecting plate is in a layer different from the first peripheral voltage supply line and the plurality of second peripheral voltage supply lines.

2. The array substrate of claim 1, wherein the plurality of second peripheral voltage supply lines are spaced apart from the first peripheral voltage supply line, respectively, by different distances.

3. The array substrate of claim 1, further comprising voltage supply lines extending along a first direction through a plurality of pixel driving circuit regions in a display area, the plurality of pixel driving circuit regions being adjacent to the corner region;

wherein a respective second peripheral voltage supply line of the plurality of second peripheral voltage supply lines is connected to multiple voltage supply lines extending through a respective region of the plurality of pixel driving circuit regions; and the plurality of pixel driving circuit regions are spaced apart from the first peripheral voltage supply line, respectively, by different distances.

4. The array substrate of claim 3, wherein the electrical connecting structure is at least partially in a region between the first peripheral voltage supply line and the plurality of pixel driving circuit regions.

5. The array substrate of claim 1, wherein an orthographic projection of the electrical connecting structure on a base substrate at least partially overlaps with an orthographic projection of at least one of the plurality of second peripheral voltage supply lines on the base substrate.

6. The array substrate of claim 1, wherein the electrical connecting structure comprises a plurality of first connecting lines; and a respective first connecting line of the plurality of first connecting lines electrically connects at least one of the plurality of second peripheral voltage supply lines with the first peripheral voltage supply line.

7. The array substrate of claim 6, wherein the electrical connecting structure electrically connects the plurality of second peripheral voltage supply lines with each other, through one or more of the plurality of first connecting lines.

8. The array substrate of claim 6, wherein at least a first one of the plurality of first connecting lines electrically connects each of the plurality of second peripheral voltage supply lines with the first peripheral voltage supply line; and at least a second one of the plurality of first connecting lines electrically connects only one of the plurality of second peripheral voltage supply lines with the first peripheral voltage supply line.

9. The array substrate of claim 1, wherein the array substrate is absent of an insulating layer between the connecting plate and the first peripheral voltage supply line; and the connecting plate is in direct contact with the first peripheral voltage supply line.

10. The array substrate of claim 1, wherein the connecting plate is a unitary structure;

an orthographic projection of the connecting plate on a base substrate at least partially overlaps with an orthographic projection of the first peripheral voltage supply line on the base substrate; and an orthographic projection of the connecting plate on the base substrate at least partially overlaps with an orthographic projection of the plurality of second peripheral voltage supply lines on the base substrate.

11. The array substrate of claim 1, comprising one or more grooves extending at least partially into the connecting plate;

wherein at least one groove of the one or more grooves is in a region between two anode connecting pads of a plurality of anode connecting pads that are directly adjacent to the at least one groove, where an average distance between the two anode connecting pads is greater than an average value of average distances respectively between pairs of directly adjacent anode connecting pads of the plurality of anode connecting pads.

12. A display apparatus, comprising the array substrate of claim 1, and one or more integrated circuits connected to the array substrate.

13. An array substrate, comprising a voltage supply network;

wherein the voltage supply network comprises, in a corner region of a peripheral area:

a first peripheral voltage supply line;

a plurality of second peripheral voltage supply lines; and an electrical connecting structure configured to connect the plurality of second peripheral voltage supply lines with the first peripheral voltage supply line;

wherein the electrical connecting structure crosses over at least one of the plurality of second peripheral voltage supply lines;

wherein the electrical connecting structure comprises a plurality of first connecting lines; and a respective first connecting line of the plurality of first connecting lines electrically connects at least one of the plurality of second peripheral voltage supply lines with the first peripheral voltage supply line;

wherein the electrical connecting structure further comprises a plurality of third peripheral voltage supply lines;

wherein the plurality of first connecting lines and the plurality of third peripheral voltage supply lines interconnect with each other; and an orthographic projection of the plurality of third peripheral voltage supply lines on a base substrate at least partially overlaps with an orthographic projection of the plurality of second peripheral voltage supply lines on the base substrate.

14. The array substrate of claim 13, wherein the plurality of first connecting lines and the plurality of third peripheral voltage supply lines are in a same layer, and are parts of a unitary structure.

15. The array substrate of claim 13, wherein a respective first connecting line of the plurality of first connecting lines is connected to one or more second peripheral voltage supply lines of the plurality of second peripheral voltage supply lines through one or more first vias extending through at least an insulating layer;

the respective first connecting line of the plurality of first connecting lines is connected to the first peripheral voltage supply line through one or more second vias extending through at least the insulating layer; and a respective third peripheral voltage supply line of the plurality of third peripheral voltage supply lines is connected to a respective second peripheral voltage supply line of the plurality of second peripheral voltage supply lines through one or more third vias extending through at least the insulating layer.

16. An array substrate, comprising a voltage supply network;

wherein the voltage supply network comprises, in a corner region of a peripheral area:

a first peripheral voltage supply line;

a plurality of second peripheral voltage supply lines; and an electrical connecting structure configured to connect the plurality of second peripheral voltage supply lines with the first peripheral voltage supply line;

wherein the electrical connecting structure crosses over at least one of the plurality of second peripheral voltage supply lines;

wherein the electrical connecting structure is in an additional display area where multiple light emitting elements are present, and transistors and capacitors of multiple pixel driving circuits are absent;

the array substrate further comprises a plurality of anode connecting pads extending from a display area into the additional display area; and a respective anode connecting pad of the plurality of anode connecting pads electrically connects an anode of a respective light emitting element of the multiple light emitting elements in the additional display area to a respective pixel driving circuit of the multiple pixel driving circuits in the display area.

17. The array substrate of claim 16, wherein at least a portion of the first peripheral voltage supply line is in the additional display area;

an orthographic projection of the plurality of anode connecting pads on a base substrate at least partially overlaps with an orthographic projection of the first peripheral voltage supply line on the base substrate; and the respective anode connecting pad crosses over at least one of the plurality of second peripheral voltage supply lines.

18. The array substrate of claim 16, wherein the electrical connecting structure comprises a plurality of first connecting lines; and an orthographic projection of the plurality of anode connecting pads on a base substrate at least partially overlaps with an orthographic projection of the plurality of first connecting lines on the base substrate.

19. The array substrate of claim 16, wherein the electrical connecting structure comprises a plurality of first connecting lines;

the plurality of first connecting lines and the plurality of anode connecting pads do not cross over each other; and an orthographic projection of a respective first connecting line of the plurality of first connecting lines on a base substrate is between orthographic projections of two adjacent anode connecting pads of the plurality of anode connecting pads on the base substrate.

* * * * *